United States Patent
Angelopoulos et al.

(10) Patent No.: US 6,331,356 B1
(45) Date of Patent: Dec. 18, 2001

(54) PATTERNS OF ELECTRICALLY CONDUCTING POLYMERS AND THEIR APPLICATION AS ELECTRODES OR ELECTRICAL CONTACTS

(75) Inventors: Marie Angelopoulos, Cortlandt Manor; Christos Dimitrios Dimitrakopoulos, West Harrison, both of NY (US); Bruce Kenneth Furman, Williston, VT (US); Teresita Ordonez Graham, Irvington; Shui-Chih Alan Lien, Briarcliff Manor, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/113,807

(22) Filed: Jul. 9, 1998

Related U.S. Application Data

(63) Continuation-in-part of application No. 08/476,141, filed on Jun. 7, 1995, which is a division of application No. 08/193,926, filed on Feb. 9, 1994, now Pat. No. 5,721,299, which is a continuation-in-part of application No. 07/357,565, filed on Dec. 16, 1994, now Pat. No. 5,198,153, application No. 09/113,807, filed on Jul. 9, 1998, which is a continuation-in-part of application No. 09/036,458, filed on Mar. 6, 1998, now abandoned, and a continuation-in-part of application No. PCT/US97/20862, filed on Nov. 10, 1997

(60) Provisional application No. 60/040,129, filed on Mar. 7, 1997, provisional application No. 60/030,501, filed on Nov. 12, 1996, provisional application No. 60/040,628, filed on Mar. 7, 1997, provisional application No. 60/040,159, filed on Mar. 7, 1997, provisional application No. 60/040,130, filed on Mar. 7, 1997, provisional application No. 60/040,132, filed on Mar. 7, 1997, and provisional application No. 60/040,131, filed on Mar. 7, 1997.

(51) Int. Cl.[7] ............................. B32B 9/04; B32B 27/06; B32B 13/04; B32B 15/08; H01L 51/40

(52) U.S. Cl. ................. 428/411.1; 428/419; 428/446; 428/457; 428/461; 428/620; 438/99; 438/149; 438/197; 257/192

(58) Field of Search ................. 428/411.1, 419, 428/446, 620, 457, 461; 257/192; 438/99, 149, 197

(56) References Cited

U.S. PATENT DOCUMENTS

| 4,483,811 | 11/1984 | Hirata | 264/162 |
| 4,543,296 | * 9/1985 | Melamed | 428/522 |

(List continued on next page.)

FOREIGN PATENT DOCUMENTS

| 58-48940 | 3/1983 | (JP) . |
| 60-16143 | 1/1985 | (JP) . |

(List continued on next page.)

OTHER PUBLICATIONS

"Optical Quality Transparent Conductive Polyaniline Films", Y. Cao et al., Synthetic Metals, 55–57 (1993), pp. 3526–3531.

(List continued on next page.)

*Primary Examiner*—Paul Thibodeau
*Assistant Examiner*—Holly C. Rickman
(74) *Attorney, Agent, or Firm*—Daniel P. Morris

(57) ABSTRACT

Electronic devices having patterned electrically conductive polymers providing electrical connection thereto and methods of fabrication thereof are described. Liquid crystal display cells are described having at least one of the electrodes providing a bias across the liquid crystal material formed from a patterned electrically conductive polymer. Thin film transistors having patterned electrically conductive polymers as source drain and gate electrodes are described. Light emitting diodes having anode and coated regions formed from patterned electrically conductive polymers are described. Methods of patterning using a resist mask; patterning using a patterned metal layer; patterning the metal layer using a resist; and patterning the electrically conductive polymer directly to form electrodes and anode and cathode regions are described.

32 Claims, 34 Drawing Sheets

U.S. PATENT DOCUMENTS

| | | | |
|---|---|---|---|
| 4,550,067 | 10/1985 | Horiba et al. | 429/213 |
| 4,557,985 | 12/1985 | Voss | 429/191 |
| 4,874,735 | 10/1989 | O'Brien et al. | 502/159 |
| 5,107,308 | 4/1992 | Koezuka et al. | 357/8 |
| 5,294,504 | 3/1994 | Otagawa et al. | 429/213 |
| 5,312,762 | 5/1994 | Guiseppi-Elie | 436/149 |
| 5,363,124 | 11/1994 | Arway | 347/74 |
| 5,446,577 | 8/1995 | Bennett et al. | 359/273 |
| 5,457,564 | 10/1995 | Leventis et al. | 359/271 |
| 5,527,646 | 6/1996 | Ogino et al. | 430/5 |
| 5,665,492 | 9/1997 | Sotomura | 429/213 |
| 5,672,444 | 9/1997 | Kuriyaki et al. | 429/213 |
| 5,723,873 | 3/1998 | Yang | 257/40 |
| 5,818,636 | 10/1998 | Leventis et al. | 359/273 |
| 5,854,139 * | 12/1998 | Aratani et al. | 438/780 |

FOREIGN PATENT DOCUMENTS

| | | |
|---|---|---|
| 63-177443 | 7/1988 | (JP) . |
| 7-273110 | 10/1995 | (JP) . |

OTHER PUBLICATIONS

Juey H. Lai, "Polymers for Electronic Applications," Library of Congress Cataloging–In–Publication Data, p. 94–95 and 137–147, 1989.

* cited by examiner

Method 1

1. Apply conducting polymer on substrate

2. Apply resist to conducting polymer

3. Expose and develop

4. Pattern transfer with RIE

5. Strip resist

Method 2

1. Apply conducting polymer on substrate

2. Deposit metal through metal mask

3. Pattern transfer with RIE

4. Etch metal using dilute HCl solution

Method 3

1. Apply conducting polymer on substrate

2. Deposit metal on conducting polymer

3. Apply resist to metal

4. Expose and develop

5. Etch metal using acid etch

6. Pattern transfer with RIE

Resist
Metal
Conducting Polymer
Substrate

7. Strip resist

Metal
Conducting Polymer
Substrate

8. Etch metal using dilute HCl solution

Conducting Polymer
Substrate

Method 4

1. Apply conducting polymer on substrate

Conducting Polymer
Substrate

2. Expose to radiation and develop

Mask
Conducting Polymer
Substrate

2. Patterned conducting polymer

Conducting Polymer
Substrate

PATTERNS OF ELECTRICALLY CONDUCTING POLYMERS AND THEIR APPLICATION AS ELECTRODES OR ELECTRICAL CONTACTS

This application claims priority from, and is a continuation-in-part of, International Application No. PCT/US97/20862 filed on Nov. 10, 1997 and published on May 22, 1998, the teaching of which is incorporated herein by reference.

This application is a continuation-in-part of copending U.S. application Ser. No. 08/476,141 filed Jun. 7, 1995 entitled, "Electrically Conductive and Abrasion/Scratch Resistance Polymeric Materials and Uses Thereof" to Angelopoulos et al., the teaching of which is incorporated herein by reference. U.S. application Ser. No. 08/476,141 is a division of U.S. application Ser. No. 08/193,926 now issued as U.S. Pat. No. 5,721,299 which is a continuation-in-part of and incorporated by reference U.S. application Ser. No. 07/357,565 filed May 26, 1989 issued as U.S. Pat. No. 5,198,153. Thus, the teaching of U.S. application Ser. No. 08/357,565 filed May 26, 1989 is incorporated herein by reference. U.S. application Ser. Nos. 08/476,141 and 08/357,565 teach electrically conductive compositions, structures and methods useful to practice the present invention.

This application is a continuation-in-part of U.S. application Ser. No. 09/036,458 filed Mar. 6, 1998 now abandoned entitled, "Methods of Processing and Synthesizing Electrically Conductive Polymers and Precursors Thereof to Form Electrically Conductive Polymers having High Electrical Conductivity", the teaching of which is incorporated herein by reference. This application teaches highly conductive polymers and methods of fabrication useful to practice the present invention.

This application claims priority from, through the claim of priority of PCT/US97/20862, Provisional Application Serial No. 60/040,129 filed Mar. 7, 1997 entitled, "Method of Patterning Electrically Conductive Polymer Films to Form Electrodes and Interconnection Conductors on a Surface Using a Resist to Pattern a Metal Layer to Pattern an Electrically Conductive Polymer Layer", the teaching of which is incorporated herein by reference, and This application claims priority from, through the claim of priority of PCT/US97/20862, Provisional Application Serial No. 60/030,501 filed Nov. 12, 1996 entitled, "SOLUTION APPLIED, IMAGEABLE, TRANSPARENT POLYMERS AS CONDUCTING ELECTRODES" to M. Angelopoulos et al., the teaching of which is incorporated herein by reference, and This application claims priority from, through the claim of priority of PCT/US97/20862, Provisional Application Serial No. 60/040,335 filed Mar. 7, 1997 entitled, "PATTERNS OF ELECTRICALLY CONDUCTING POLYMERS AND THEIR APPLICATION AS ELECTRODES AND ELECTRICAL CONTACTS" to M. Angelopoulos et al., the teaching of which is incorporated herein by reference, and This application claims priority from, through the claim of priority of PCT/US97/20862, Provisional Application Serial No. 60/040,628 filed Mar. 7, 1997 entitled, "PATTERNS OF ELECTRICALLY CONDUCTING POLYMERS AND THEIR APPLICATION AS ELECTRODES IN FIELD EFFECT TRANSISTORS" to M. Angelopoulos et al., the teaching of which is incorporated herein by reference, and This application claims priority from, through the claim of priority of PCT/US97/20862, Provisional Application Serial No. 60/040,159 filed Mar. 7,1997 entitled, entitled, "METHODS OF PATTERNING ELECTRICALLY CONDUCTIVE POLYMER FILMS TO FORM ELECTRODES AND INTERCONNECTION CONDUCTORS ON A SURFACE" to M. Angelopoulos et al., the teaching of which is incorporated herein by reference, and This application claims priority from, through the claim of priority of PCT/US97/20862, Provisional Application Serial No. 60/040,130 filed Mar. 7, 1997 entitled, "Method of Patterning Electrically Conductive Polymer Films to Form Electrodes and Interconnection Conductors on a Surface Using a Resist Mask", the teaching of which is incorporated herein by reference, and This application claims priority from, through the claim of priority of PCT/US97/20862, Provisional Application Serial No. 60/040,132 filed Mar. 7, 1997 entitled, "STRUCTURES HAVING PATTERNED ELECTRICALLY CONDUCTIVE POLYMER FILMS AND METHODS OF FABRICATION THEREOF" to M. Angelopoulos et al., the teaching of which is incorporated herein by reference, and This application claims priority from, through the claim of priority of PCT/US97/20862, Provisional Application Serial No. 60/040,131 filed Mar. 7, 1997 entitled, "LIGHT EMITTING DIODES HAVING ELECTRICALLY CONDUCTIVE POLYMER ELECTRODES" to M. Angelopoulos et al., the teaching of which is incorporated herein by reference.

FIELD OF THE INVENTION

The present invention is directed to patterned electrically conducting polymers and methods of fabrication thereof. More particularly the present invention is directed to electronic devices having electrically conductive polymers as electrode contacts and active regions and patterned electrical contacts formed from electrically conductive polymers, in particular the application of these polymers as electrodes or electrical contacts for electro-optical transducers such as liquid crystal displays, electro-optical modulators, diodes, light emitting diodes, transistors, and the like.

BACKGROUND

The electrical contacts or electrodes in current electro-optical transducers and other devices are generally metals. Metals are deposited by evaporative or sputtering processes which require expensive tooling and overall are a cumbersome processes.

Electrically conducting polymers are a relatively new class of electronic materials which are taught herein as candidates for electrode materials. These polymers combine the electrical properties of metals with the processing advantages of polymers.

Herein we describe examples of electrically conductive polymers such as substituted and unsubstituted electrically conducting polyanilines, polyparaphenylenes, polyparapheylenevinylenes, polythiophenes, polyfurans, polypyrroles, polyselenophenes, polyisothianapthenes, polyphenylene sulfides, polyacetylenes, polypyiidylvinylenes, polyazines, combinations thereof and blends thereof with other polymers and copolymers of the monomers thereof.

In order for these polymers to be used as an electrode in a device they preferably have suitable electrical conductivity and be easily patternable. In addition, these polymers preferably do not outgas causing contamination of the devices to which they provide electrical contact. Furthermore, the conducting polymers are preferably patternable by lithography. Patterning preferably does not result in a decrease in the electrical conductivity of the polymer nor cause any deterioration of the properties of the electrically conducting polymer.

It is therefore desirable to develop methods of patterning these polymers so that they can be used on any conducting polymer system and without negatively impacting the conducting polymer so that the patterned electrically conductive polymer can be used as an electrical contact to a device. It is also desirable that the conducting polymer properties be controlled so that outgassing or contamination of the devices does not occur.

OBJECTS

It is an object of the present invention to provide improved electronic devices using electrically conductive polymers.

It is an object of the present invention to provide patterns of electrically conductive polymers and methods of fabrication thereof. In particular, a resist is first patterned and the resist pattern is subsequently transferred to the conducting polymer. Once the pattern is transferred to the conducting polymer, the result is removed.

It is an object of the present invention to provide patterns of electrically conductive polymers by the use of a resist which is applied to the conducting polymer.

In particular, the metal is first patterned and the metal pattern is subsequently transferred to the conducting polymer followed by removal of the metal.

It is another object of the present invention to provide patterns of electrically conducting polymers by the use of a metal which is applied to the conducting polymer.

It is another object of the present invention to provide patterns of electrically conducting polymers having high electrical conductivity.

It is another object of the present invention to provide patterns of electrically conducting polymers having high optical transmission.

It is another object of the present invention to provide patterns of electrically conducting polymers having good thermal stability.

It is another object of the present invention to provide electrically conducting polymers having high optical transmission and high electrical conductivity.

It is another object of the present invention to provide electrically conducting polymers and patterns of electrically conducting polymers that can be used as electrical contacts or electrodes.

It is another object of the present invention to provide electrically conducting polymers and patterns of electrically conducting polymers that can be used as electrical contacts or electrodes in electro-optical transducers and devices.

It is another object of the present invention to provide electrically conducting polymers and patterns of electrically conducting polymers that can be used as electrodes in liquid crystal displays.

It is another object of the present invention to provide a liquid crystal display comprising electrically conducting polymer electrodes.

It is another object of the present invention to provide a liquid crystal display comprising electrically conducting polymer electrode and a metal electrode It is another object of the present invention to provide a liquid crystal display comprising electrically conducting polymer electrode and an indium tin oxide electrode.

It is another object of the present invention to provide an active matrix thin film transistor (TFT) liquid crystal display consisting of one or more electrically conducting polymer electrode.

It is another object of the present invention to provide a liquid crystal display comprising one or more electrically conducting polymer electrode which exhibits good charge retention.

It is another object of the present invention to provide a liquid crystal display comprising one or more electrically conducting polymer electrodes which exhibits good transmission/voltage characteristics.

It is another object of the present invention to provide a liquid crystal display comprising one or more electrically conducting polymer electrode which exhibits good image sticking characteristics.

It is another object of the present invention to provide electrically conducting polymers and patterns of electrically conducting polymers that can be used as one or more electrode in light emitting diodes.

It is another object of the present invention to provide organic or inorganic light emitting diodes comprising one or more electrically conducting polymer electrodes.

It is another object of the present invention to provide organic or inorganic light emitting diodes consisting of one or more patterned electrically conducting polymer electrodes.

It is another object of the present invention to provide light emitting diodes having hole injection and/or electron injecting regions formed from electrically conductive polymers.

It is another object of the present invention to provide electrically conducting polymers and patterns of electrically conducting polymers that can be used as electrical contacts to transistors such as one or more of the drain source and gate electrodes in field effect transistor (FET) devices and contacts to bipolar transistors.

It is another object of the present invention to provide patterns of electrically conducting polymers that exhibit good conductivity, good thermal stability, no outgassing, and in certain cases high optical transmission.

It is another object of the present invention to provide patterns of electrically conducting polymers by the application of a resist on the conducting polymer whereby the resist is exposed and developed forming a pattern in the resist. The resist pattern is transferred to the conducting polymer by etching followed by removal of the resist.

It is another broad aspect of the present invention to provide patterns of electrically conducting polymers by the application of a metal on the conducting polymer surface. The metal is patterned by the application of a resist which is exposed and developed. The resist pattern is transferred to the metal followed by pattern transfer to the conducting polymer by etching techniques.

It is another broad aspect of the present invention to provide patterns of electrically conducting polymers by the application of a patterned metal layer on the conducting polymer, etching of the pattern into the conducting polymer and removal of the metal.

It is a more particular aspect of the present invention to provide a TFT switch for liquid crystal displays in which one or more of the source, drain and gate electrodes comprise electrically conducting polymer exhibiting good conductivity and good thermal stability.

It is another object of the present invention to provide a light emitting diode consisting of an electrically conducting polymer electrode and a metal electrode.

It is another object of the present invention to provide electrically conducting polymers and patterns of electrically conducting polymers that can be used as one or more electrodes in light emitting diodes.

It is another object of the present invention to provide organic or inorganic light emitting diodes consisting of one or more electrically conducting polymer electrodes.

It is another object of the present invention to provide organic or inorganic emitting diodes consisting of one or more patterned electrically conducting polymer electrodes.

It is another object of the present invention to provide a light emitting diode comprising a conducting polymer as a hole injecting electrode or as an electron injecting layer.

SUMMARY OF THE INVENTION

Accordingly, it is a broad aspect of the present invention to provide electrical conductive polymers and patterned electrically conducting polymers and to provide methods of patterning thereof.

It is a broad aspect of the present invention to provide an electronic device having a patterned electrically conductive polymer providing electrical connection to the device.

It is a broad aspect of the present invention to dispose a patterned electrically conductive polymer on an electronic device to provide electrical contact to the device.

It is another broad aspect of the present invention to provide patterns of electrically conducting polymers that exhibit good conductivity, good thermal stability, no outgassing, and in certain cases high optical transmission.

It is another broad aspect of the present invention to provide patterns of electrically conductive polymers by the application of a resist on the conducting polymer where the resist is exposed and developed and the pattern is transferred to the conducting by etching techniques followed by removal of the resist.

It is another broad aspect of the present invention to provide patterns of electrically conducting polymers by the application of a metal on the conducting polymer surface. The metal is patterned by an application of a resist which is exposed and developed. The resist pattern is transferred to the metal followed by transfer to the electrically conducting polymer by etching techniques followed by removal of the metal.

It is another broad aspect of the present invention to provide patterns of electrically conductive polymers by the application of a patterned metal layer on the electrically conductive polymer followed by etching of the pattern into the electrically conducting polymer and removal of the metal.

It is another broad aspect of the present invention to provide electrically conducting polymers and patterns of electrically conducting polymers as electrical contacts to electro-optical transducers and devices.

It is another broad aspect of the present invention to provide electro-optical transducers and devices having one or more electrically conducting polymer electrodes.

It is a more particular aspect of the present invention to provide a liquid crystal display having one or more electrically conducting polymer electrodes. In one embodiment the liquid crystal display has an indium tin oxide electrode and an electrically conducting polymer electrode.

It is a more particular aspect of the present invention to provide a liquid crystal display having one or more electrically conducting polymer electrodes exhibiting high charge retention, good transmission/voltage characteristics, and good image sticking properties.

A more particular aspect of the present invention is an electronic device having an electronically active portion having a surface; the surface has a dielectric layer having an opening having a perimeter therein exposing the electronically active portion; a layer of electrically conductive polymer is disposed on the dielectric layer; the layer of electrically conductive polymer electrically contacts the electronically active portion through the opening and overlapping the perimeter to be disposed on the dielectric layer.

Another more particular aspect of the present invention is a liquid crystal display structure having:

a first substrate;

a second substrate;

a liquid crystal layer disposed between the first substrate and the second substrate;

at least one of the first substrate and the second substrate has an electrically conductive polymer disposed thereon providing means for applying an electrical potential across the liquid crystal layer.

Another more particular aspect of the present invention is field effect transistor having source, drain and gate electrodes at least one of which is a patterned electrically conductive polymer.

Another more particular aspect of the present invention is a structure having:

a substrate;

a patterned electrically conductive polymer gate disposed on the substrate;

the gate being an electrically conductive polymer;

an insulating layer disposed on the patterned gate;

a patterned source electrode disposed on the insulating layer;

a patterned drain electrode disposed on the insulating layer;

the patterned source electrodes and the patterned drain electrodes being formed from an electrically conductive polymer; and a semiconducting material disposed in the patterned source and patterned drain and the gate between the patterned source and said patterned drain.

Another more particular aspect of the present invention is a light-emitting diode having: a substrate, an anode structure, an electroluminescent region, and a cathode structure wherein the cathode structure or the anode structure is an electrically conductive polymer.

Another more particular aspect of the present invention is an organic light emitting diode having: a substrate, an anode, an organic electroluminescent layer and a cathode, the anode or cathode in this structure being an electrically conducting polymer.

Another more particular aspect of the present invention is a method of:

providing a substrate having a layer of an electrically conductive polymer material;

disposing on the layer of electrically conductive polymer material a resist layer; exposing the resist to a pattern of energy;

developing the pattern of radiation forming a pattern in the resist comprising covered and uncovered regions of said electrically conductive polymer; removing the electrically conductive polymer in the uncovered regions, and removing the resist leaving a pattern of said electrically conductive polymer.

Another more particular aspect of the present invention is a method of:

providing a substrate having a layer of electrically conductive polymer material;

depositing a pattern of a metal layer through a metal mask forming a patterned metal layer on the layer of electrically conductive polymer, forming regions of the electrically conductive polymer covered by the metal pattern and uncovered regions of the electrically conductive polymer; etching the uncovered regions to remove the exposed electrically conductive polymer regions; and removing the metal resulting in a pattern of an electrically conducting polymer.

Another more particular aspect of the present invention is a method of:

providing a substrate having a layer of an electrically conductive polymer;

disposing a layer of metal on the layer of electrically conductive polymer;

disposing a resist on the metal layer;

exposing the resist to pattern of radiation;

developing the pattern of radiation forming a pattern in the resist resulting in covered and uncovered regions of the metal layer;

removing the metal layer in said uncovered regions, resulting in covered and uncovered regions of said electrically conductive polymer;

removing the uncovered regions of said electrically conductive polymer;

removing the resist; and removing remaining portions of the metal layer resulting in a pattern of an electrically conducting polymer.

Another more particular aspect of the present invention is a method of:

providing a substrate having a layer of an electrically conductive polymer material;

wherein the electrically conductive polymer contains energy sensitive constituents; exposing the electrically conductive polymer to a pattern of energy forming a pattern of exposed and unexposed regions; and removing the electrically conductive polymer in one of the exposed and unexposed regions to form a pattern of said electrically conductive polymer on the substrate.

BRIEF DESCRIPTION OF THE DRAWINGS

Further objects, features, and advantages of the present invention will become apparent from a consideration of the following description of the invention when in conjunction with the drawings FIGS. in which.

DETAILED DESCRIPTION

The present invention is directed to devices using electrically conducting polymers including substituted and unsubstituted polyanilines, polyparaphenylenes, polyparaphenylene vinylenes, polythiophenes, polypyrroles, polyfurans, polyselenophenes, polyisothianapthenes, polyphenylene sulfides, polyacetylenes, polypyridyl vinylenes, combinations thereof and blends thereof with other polymers, copolymers of the monomers thereof. It is found that these polymers can be patterned lithographically to form electrically conductive patterns which can act as electrodes or electrical contacts in various electro-optical transducers and devices. The present invention is also directed to electro-optical transducers and devices consisting of one or more electrically conductive polymer electrodes.

Figure 1:
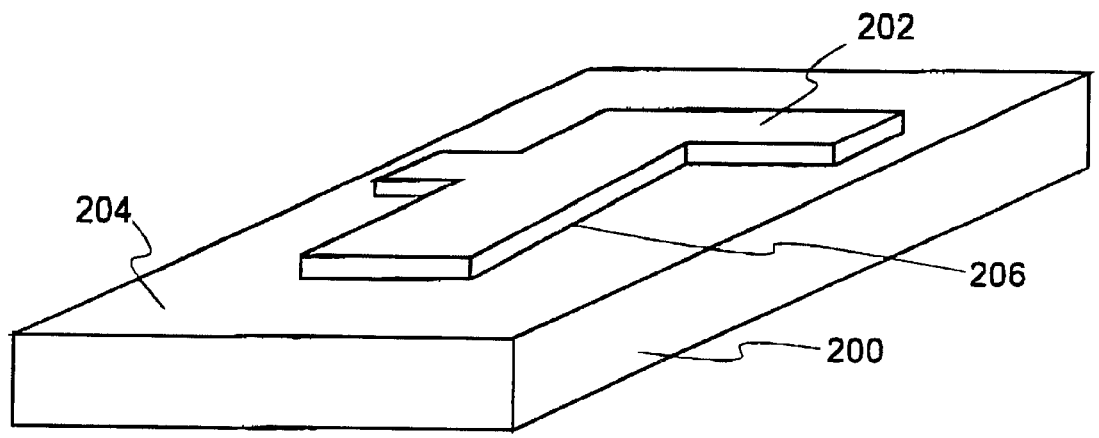
FIG. 1 is a schematic perspective view of an exemplary embodiment of a structure according to the present invention including a patterned electrically conductive polymer.

FIG. 1 schematically shows in perspective substrate 200 having patterned electrically conductive polymer 202 disposed thereon. The electrically conductive polymer 202 forms electrical contact to surface 204 of substrate 200 along at least part of the interface 106 between the electrically conductive polymer 202 and surface 204. The pattern 102 can electrically interconnect a number of electronic devices formed in substrate 100.

Figure 2:
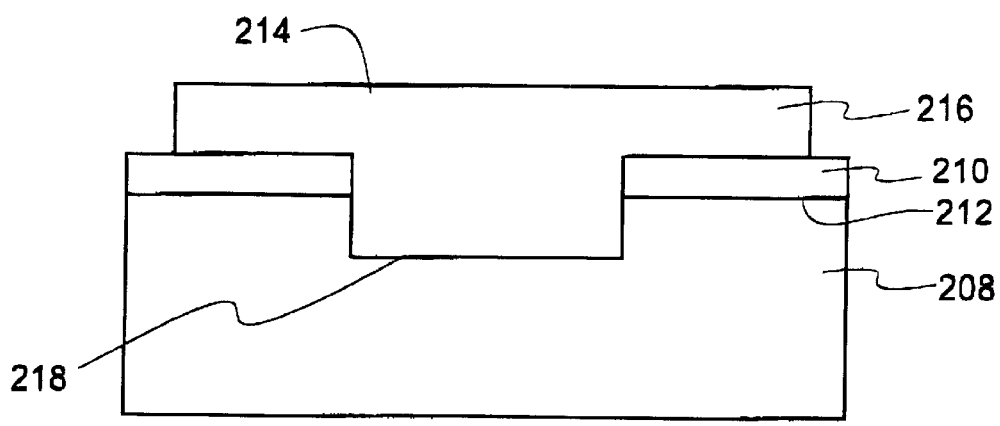
FIG. 2 is a schematic side view of another exemplary embodiment of a structure according to the present invention including a patterned electrically conductive polymer.

FIG. 2 shows schematically a side view of a substrate 208 having a dielectric layer 210 on surface 212 of substrate 208. Dielectric layer 210 has a through-hole 214 therein with patterned electrically conductive polymer 216 disposed on dielectric layer 110 to fill through-hole 114 to contact surface 118 of substrate 108. Some examples of devices useful to practice the present invention are liquid crystal displays (LCD), transistors (bipolar and field effect transistors), light emitting diodes, etc.

LCD DEVICES

Liquid crystal based electro-optical transducers are currently the state of the art technology for the manufacture of flat panel displays in particular for portable electronic equipment. It is expected that this technology will continue to dominate in the future as the industry moves towards large area displays.

Figure 3:
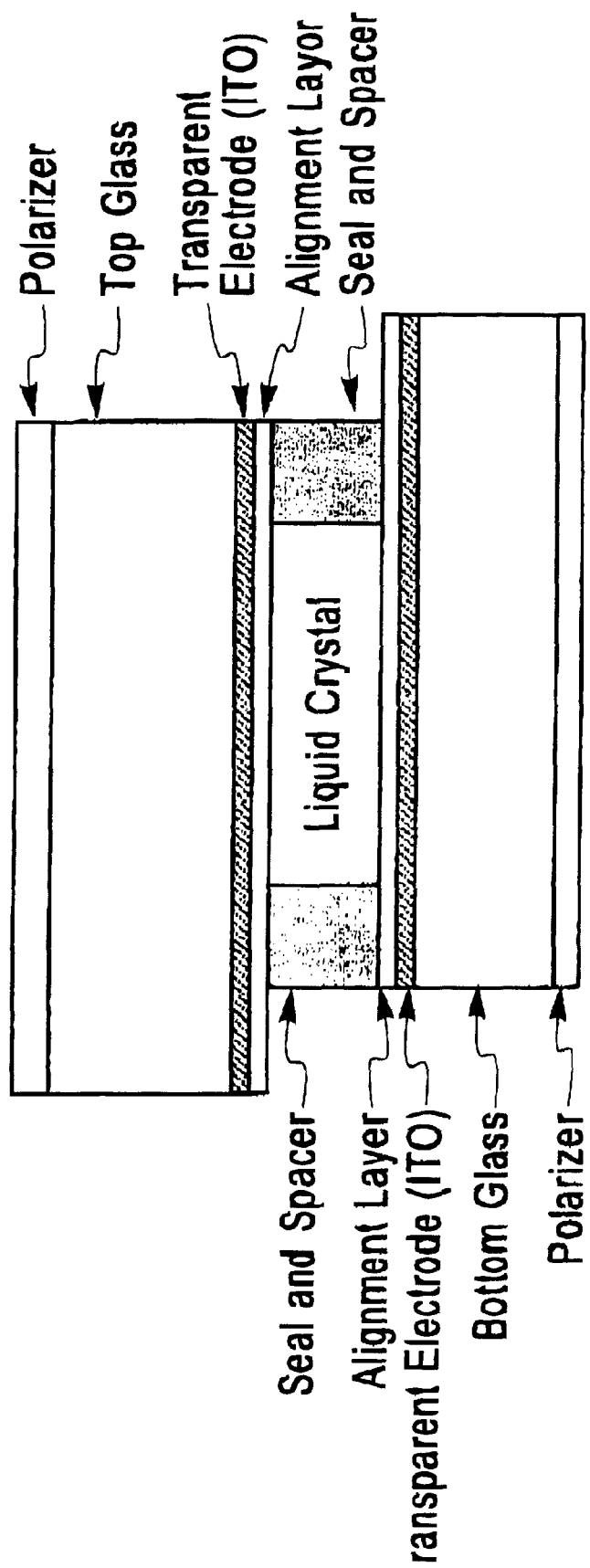
FIG. 3 is a schematic of a typical liquid crystal configuration.
Figures 4A, 4B:
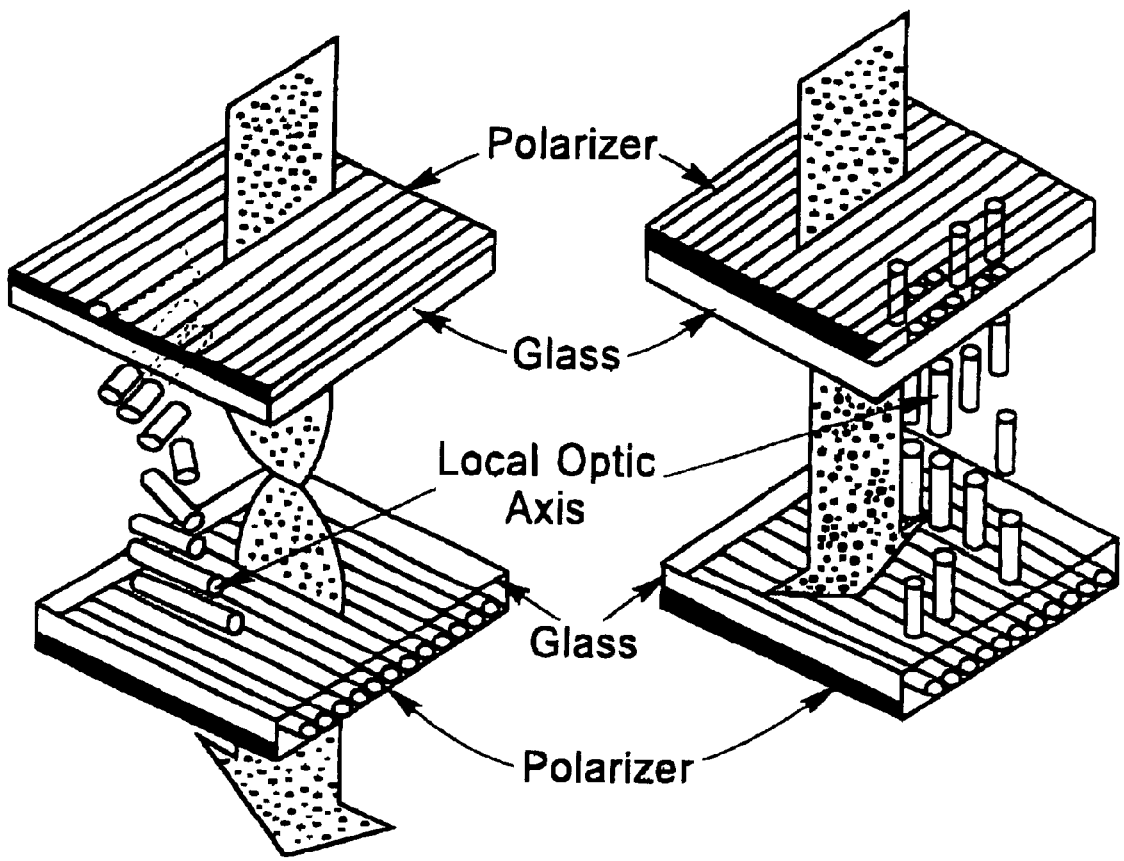
FIG. 4 is a schematic of the operation of a twisted nematic liquid crystal cell; in (a) voltage is applied and the transmission of the cell is maximum whereas in (b) a voltage is applied and the transmission of the cell is minimum.

A typical liquid crystal (twisted nematic) cell is shown in FIG. 3. In this device the nematic liquid crystal is placed between two glass plates which are on average 5–20&mu.m apart. On the surface of the glass plates is deposited the transparent electrode, indium tin oxide (ITO). On the ITO is deposited an alignment layer which is rubbed in such a way that the nematic liquid crystal aligns parallel to the rubbed direction. If the two alignment layers are rubbed at 90°. angles to one another the liquid crystal adapts a twisted structure as is shown in FIG. 4a. If polarized light is incident on the cell, the plane of polarization will follow the twist of the molecules and thus, will be rotated by 90°. as it passes through the cell. If a second polarizer placed at the other end of the cell is also rotated 90°. relative to the first polarizer, the light will pass through the cell. When a voltage is applied to the cell an electric field is in turn applied across the liquid crystal cell. The liquid crystal molecules align themselves with the electric field (FIG. 4b) which results in disruption of the twist. The incident light now sees cross polarizers and, therefore, there is no light transmission through the cell. U.S. Pat. No. 5,623,514 describe liquid crystal cells, the teaching of which is incorporated herein by reference.

There are a variety of liquid crystal displays including passive and active matrix displays. Active matrix displays can consist of two terminal devices such as diode rings, back to back diodes and metal-insulator-metal device. Active matrix displays can also consist of three terminal devices such as thin film transistors where the material is polysilicon, amorphous silicon, amorphous germanium, cadmium selenide, etc.

Another technology that is under tremendous research and development for potential future use in flat panel displays is light emitting diodes, in particular where the electroluminescent layer is an organic material. Light emitting diodes consist of an injecting electrode, an electroluminescent layer, and an electron injecting electrode. The hole injecting electrode is most commonly indium tin oxide.

Today, flat panel displays are predominantly manufactured using thin film transistor based active matrix liquid crystals. One of the most cumbersome process steps in liquid crystal cells is the deposition and patterning of the ITO electrode. The ITO is first deposited by an evaporative process. It must then be annealed at high temperatures for several hours. The ITO is then patterned by applying a photoresist. The photoresist is exposed and developed. The pattern is transferred to the ITO by etching. The etching solution consists of a mixture of strong acids. ITO is generally deposited either before or after the thin film transistor layers have been deposited. In the latter case, the ITO acidic etching solution can cause defects in the thin film transistor devices.

It is therefore desirable to develop new electrode materials that offer a simple approach as compared to ITO but at the same time offer high optical transmission, good conductivity, good environmental and thermal stability, ease of patterning by lithography, and good liquid crystal display properties such as high charge retention, low image sticking, and good transmission/voltage characteristics. It is also desirable to develop improved electrode materials and electrical contacts for light emitting diodes and other devices.

Electrically conducting polymers are a relatively new class of electronic materials that may be considered as potential candidates for electrode materials. These polymers have the potential of combining the electrical properties of metals with the processing advantages of conventional polymers. Herein we describe substituted and unsubstituted electrically conducting polyanilines, polyparaphenylenes, polyazines, polyparapheylenevinylenes, polythiophenes, polyfurans, polypyrroles, polyselenophenes, polyisothianapthenes, polyphenylene sulfides, polyacetylenes, polypyridylvinylenes, combinations thereof and blends thereof with other polymers and copolymers of the monomers thereof.

In order for these polymers to be used as an ITO alternative or as an electrode general they must have suitable conductivity, be easily patternable and in certain cases have high optical transmission. In addition, these polymers cannot outgas as they would cause contamination of devices. In a liquid crystal display cell, outgassing by the conducting polymer would significantly reduce the charge retention of the display. Furthermore, the conducting polymers need to be easily patternable by lithography. Patterning cannot result in a decrease in the conductivity of the conducting polymer nor cause any deterioration of the properties of the conducting polymer. It is therefore desirable to develop a method of patterning these polymers, ideally a method that can be used on any conducting polymer system and does not negatively impact the properties of the conducting polymer.

One potential conducting polymer that can be used as a conducting electrode is polyaniline. Polyaniline (and other conductive polymers) is a family of polymers as described in U.S. Pat. No. 5,198,153, U.S. Pat. No. 5,200,112 and U.S. Pat. No. 5,202,061 entitled, "Electrically Conductive Polymeric Materials and Uses Thereof" incorporated herein by reference.

In order for a conductive polymer, such as polyaniline to be considered as a conducting electrode in for example liquid crystal displays, it is desirable that the polymer exhibits certain properties. By way of example, the present invention will be described with reference to polyaniline, but the invention is not limited thereto. These include:

1. It preferably exhibits an optical transmission greater than 80% in the visible range while still exhibiting sufficient conductivity and contact resistance to the device metallurgy.
2. It preferably exhibits good solubility and forms uniform coatings. Coatings preferably do not contain particles, streaks, or significant pinholes or dewets.
3. It preferably is compatible with the alignment layer that is deposited on top of the conducting electrode; the solvents used to deposit the alignment layer which in most cases is polyimide should not dissolve the polyaniline, cause significant interfacial mixing, or extract any of the dopant ions from the polyaniline. Extraction of the dopant ions would result in a decrease in conductivity of polyaniline and the dopant ions could potentially go into the alignment layer and ultimately in the liquid crystal thereby destroying the properties of the liquid crystal cell;
4. It is preferred that the polymer exhibits thermal stability at least to 150° C.;
5. It is preferred that the polymer does not exhibit outgassing as any outgassing would result in ionic contaminates going into the liquid crystal and this would destroy the characteristics of the liquid crystal cell;
6. It is preferred that the polymer provides good step coverage;
7. It is preferred that the polymer be patterned without the need of harsh etchants;

In addition to the polymer properties described above, it is also important that the liquid crystal cells made with the polyaniline preferably exhibit certain properties. These include:
1. Good Transmission vs. Voltage Characteristics;
2. Good Charge Retention at room temperature and at elevated temperature;
3. No image sticking either at room temperature nor at elevated temperature.

It is not obvious that a conductive polymer, such as polyaniline, can be used for such an application and result in the properties outlined above. It is known that polyaniline is made conducting by reacting the non-conducting form of the polymer (the base) with acids such as hydrochloric acid to result in a conducting salt. This is described in Farad. Discuss. Chem. Soc., 88, 317, by A. G. MacDiarmid and A. J. Epstein. The structure for the conducting form consists of delocalized polymeric radical cations that are neutralized by counteranions are described in U.S. patent application Ser. No. 08/370,127 filed on Jan. 9, 1995 entitled, "Deaggregated Electrically Conductive Polymers and Precursors Thereof" incorporated herein by reference below.

Ions are necessary to render the material conducting. It is well known that the presence of ions in liquid crystal panels will result in poor charge retention and poor image sticking as shown in H. Seiberle, M. Schadt, "Influence of Charge Carriers and Display Parameters on the Performance of Passively and Active Addressed LCDs", SID '92 Digest, 25 (1992). This is one of the biggest concerns using polyaniline as an electrode. The use of HCl acid as a dopant results in volatile, mobile ions. It is actually observed that HCl outgasses from thin films of polyaniline at temperatures as low as 40–50° C. This outgassing would destroy the properties of the liquid crystal (LC) as the ions would migrate into the LC. Herein, we find quite surprisingly that the polyaniline can be modified to result in a doped polymer that does not result in ion migration into the LC at room temperature nor at elevated temperatures and as a result LCDs are made with excellent charge retention and image sticking properties.

Another concern with the ions is that during the deposition of the polyimide alignment layer on top of the polyaniline electrode, the solvent used for the polyimide which generally is a highly polar solvent such as NMP or gamma-butyrolactone, both quite polar solvents, would extract the dopant ions from the polyaniline and have these ions in turn migrate into the alignment layer and into the LC. This again would destroy the properties of the display. In addition, extraction of the ions would result in a decrease in conductivity of the polyaniline. Quite surprisingly, it is found that the polyimide alignment layer proves quite compatible with the polyaniline and extraction of the ions does not occur.

Polyaniline preferably provides good optical transmission while exhibiting sufficient surface resistance and contact resistance to the data metal line beneath. One can tailor optical transmission of the polyaniline by reducing the thickness but while doing this the surface resistance of the material increases. Herein we describe a material that exhibits good optical transmission, good surface resistance and good contact resistance to metal.

Polyaniline preferably provides good step coverage. This is a major problem when using ITO. In a typical TFT configuration, Indium tin oxide (ITO) is used as the transparent conducting electrode. The ITO is deposited by sputtering and lithographically patterned by a conventional photoresist system. Then it is etched using a hot solution of a mixture of concentrated nitric and hydrochloric acids. Generally, the ITO is deposited either before or after the thin film transistor (TFT) layers and passivation layer have been deposited. To reduce the number of photolithography mask steps, the latter case is used. In this case, via holes in the passivation layer are formed to provide connection for the ITO layer to the underneath source/drain metal of TFT devices. If the passivation layer is too thick, the ITO has a step coverage problem to the via hole since ITO is deposited by a sputtering process. On the other hand, when the passivation layer is thin, pin holes are generally present and the ITO acidic etching solution can cause defects in the TFT devices or in the bus lines. Polyaniline would be deposited by a spin-coat or roller coat process. It would therefore be able to provide good step coverage. Polyaniline is also found to be patterned without the need of harsh etchants.

Figure 5:
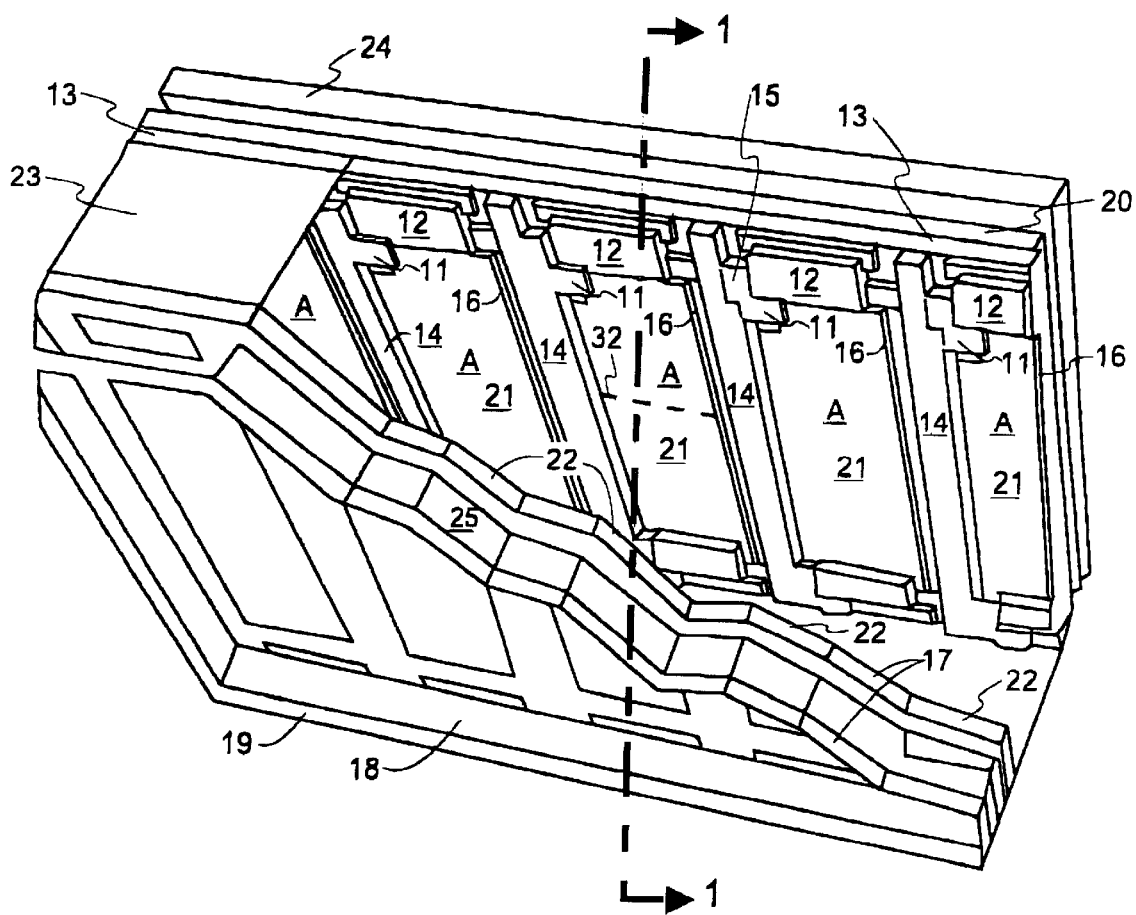
FIG. 5 is a schematic of a typical active matrix thin film transistor display.

Although this invention is suitable for a number of devices, it will be described in embodiments of an active liquid crystal display and specifically for a thin film transistor (TFT) liquid crystal display. As shown in FIG. 5, a conventional TFT display 10 comprises an array of cells or A, each cell including a thin film transistor 11 to address the cell by applying a voltage to the cell when the transistor is in its on state and a capacitor 12 which maintains the voltage after the transistor is switched off. The transistor is formed on a glass substrate 13 on the back side of the display 10 and is connected between a column data electrode 14 and a row electrode 15 and to a display transparent electrode 16 of each pixel, all at the back side of the display 10. The front side of the display is formed with a continuous common transparent electrode 17 which is spaced apart from and positioned parallel to the transparent display electrode 16. Both the electrode 17 and the display electrode 16 are preferably formed of a thin transparent conductive material, such as indium tin oxide (ITO), carried on a glass substrate. Since the display electrode 16 of each pixel is smaller in dimension then the continuous common electrode 17, a fringe field results which spreads outward from the pixel or cell edges of the display electrode to the common electrode when voltage is applied across the electrodes. Parallel with the outside of the common electrode 17 and adjacent to the glass substrate 18 is a polarizer 19, which is appropriately oriented relative to the a polarizer 20 mounted in back of the rear glass substrate 13. Alignment layers 21 and 22 are disposed on the inner surface of the display and common electrodes 16 and 17, respectively, and are in contact with a liquid crystal layer herein twisted nematic liquid crystal molecules which is sealed between the two parallel mounted glass substrates 1 and 18 carrying the alignment layers 21 and 22. On the back side of the display a visible light source (not shown) which irradiates the display 10 through a diffuser If it is desired to have the display 10 in color, a color filter 25 is disposed on the alignment layer side of the common electrode 17, and contains groups of the three primary colors (red, green and blue), each one of the primary colors being associated with one of a group of three adjacent pixels A to form a color cell.

Liquid crystal cells were fabricated in which patterned electrically conducting polymers (i.e. polyaniline) functioned as the transparent electrode 16 of each pixel element in the display 10 above ITO functions as the continuous transparent electrode 17. In addition, liquid crystal cells were fabricated in which patterned electrically conducting polymers act as the transparent electrode 16 and continuous coatings of electrically conducting polymers act as the continuous transparent electrode 17. Electrically conducting polymers also act as the transparent conducting electrode 17 and patterned ITO can act as the pixel electrode 16.

Figure 6:
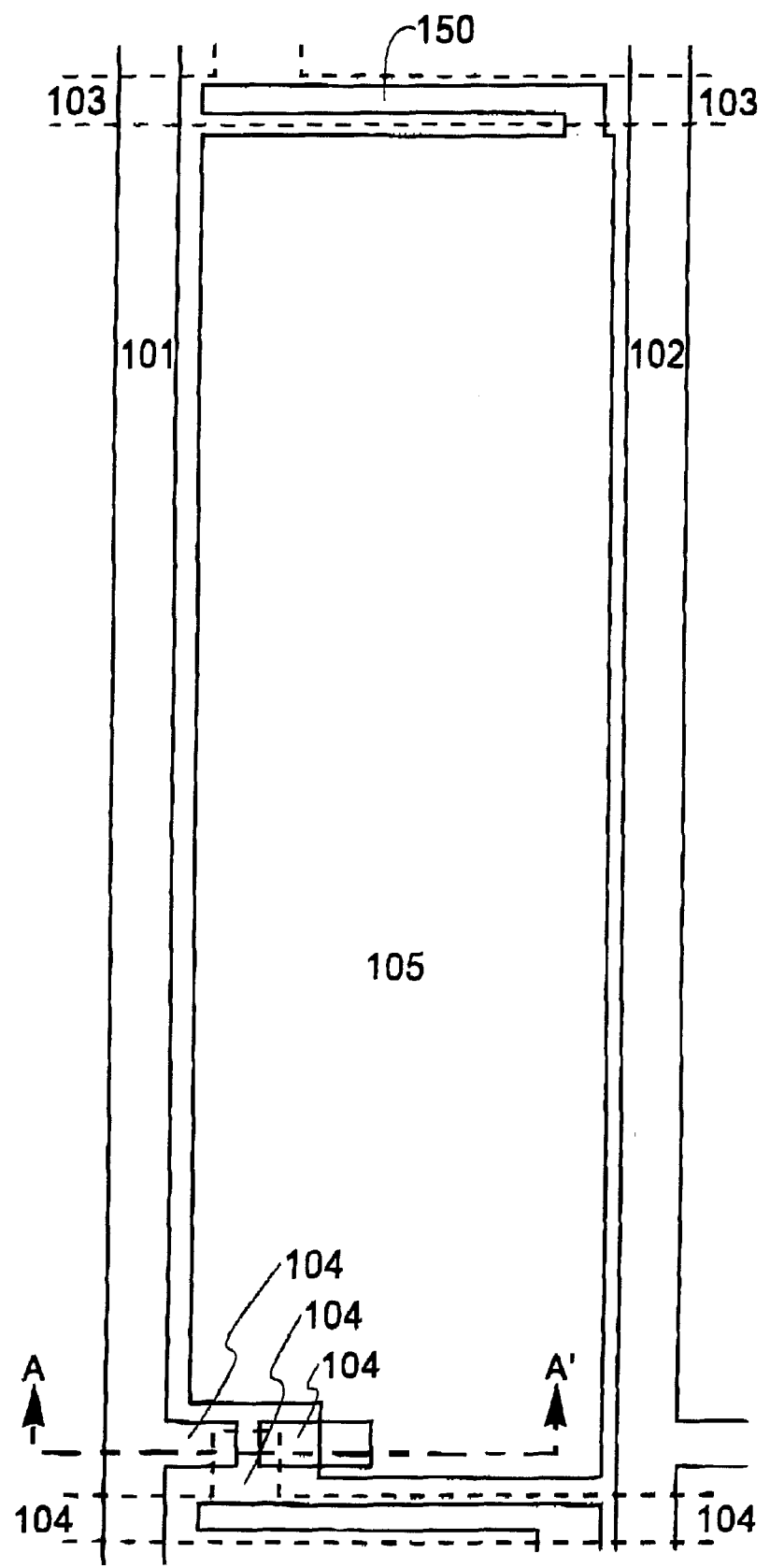
FIG. 6 shows a top view of a unit cell of a TFT/LCD display.
Figure 7:
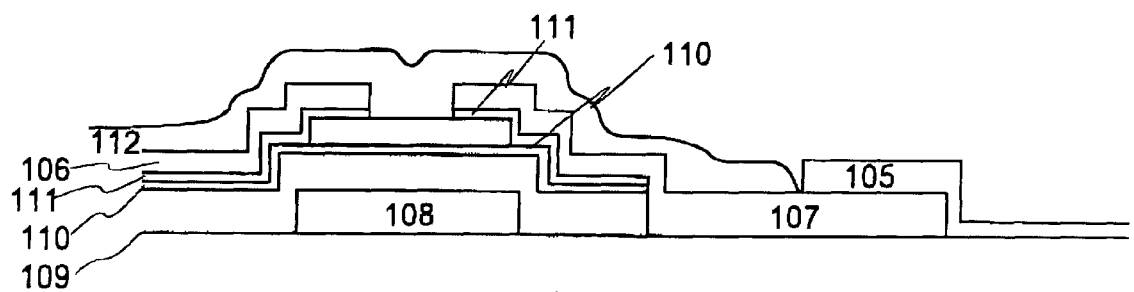
FIG. 7 shows a cross-section along line AA' of FIG. 6.
Figure 8:
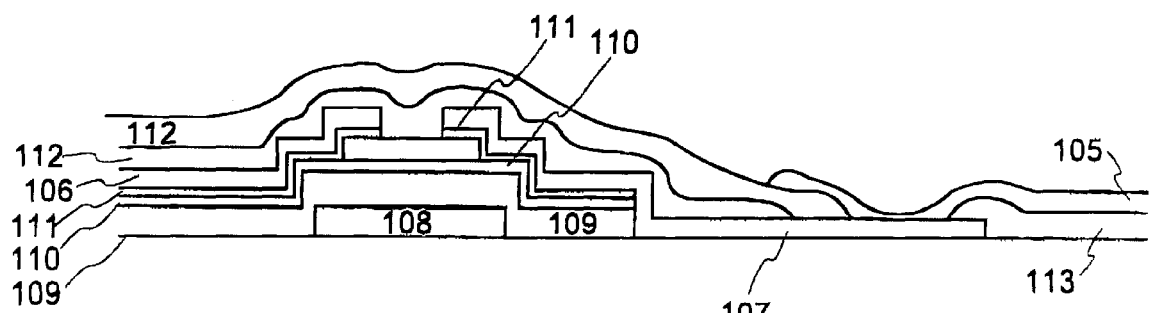
FIG. 8 shows another cross-section along line AA' of FIG. 6.
Figure 9:
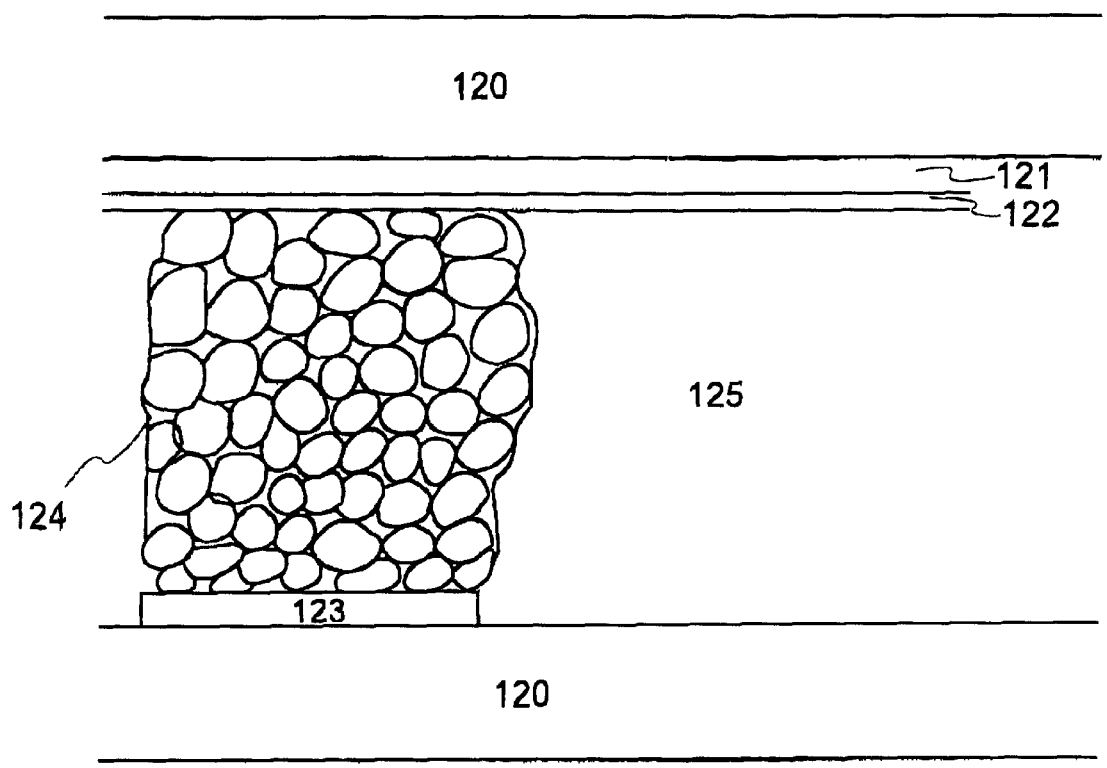
FIG. 9 shows part of the assembled liquid crystal display.

FIG. 6 shows a top view of a unit cell structure of a TFT/LCD display. 101 and 102 are the data bus lines and 103 and 104 are gate bus lines. 106, 107 and 108 form a thin film transistor (TFT), in which 108 is a protrusion of 104 and 106 is a protrusion of 101. 106 is the source electrode and 107 is the drain electrode. 106 and 107 are typically made of the same electrically conductive material such as metal. 105 is a transparent pixel electrode which is made of a conductive polymer by a photolithograph. Pixel electrode 105, top electrode on the color filter side (not shown) and the liquid crystal (not shown) between these two form a pixel capacitor. 130 is an extension of 105. 130 and 103 are separated by a layer of insulator (not shown) and form a storage capacitor. When an appropriate high voltage is applied to the gate bus line 104, the TFT is turned on. Therefore, the pixel capacitor and the storage capacitor are charged from data bus line 101 through the TFT to the designed voltage which determines the electro-optics of the liquid crystal in the pixel. Thus, the designed image is displayed. Two cross-sectional structures along the A–A' are shown on FIGS. 7 and 8. In FIGS. 7 and 8, 106 is the source electrode, 107 is the drain electrode, 108 is the gate electrode, 109 is the gate insulator layer, 110 is the amorphous silicon layer, 111 is the n+ amorphous silicon layer, 112 is the passivation layer, 105 is the pixel electrode. In FIG. 8, on top of the passivation layer 112, there is another layer 113, which is a low dielectric transparent polymer layer. The pixel electrode layer 105 is placed on top of 113 so that the pixel electrode can be extended to the top of the data bus line to increase the pixel aperture ratio. In FIG. 7, pixel electrode 105 and 107 have a direct overlap. In FIG. 8, this overlap is through a via hole on the polymer layer 113. FIG. 9 shows part of the assembled liquid crystal display. 120 is the glass substrate. 121 is the color filter layer. 122 is the conductive transparent electrode layer. 122 can be an indium tin oxide (ITO) layer or a transparent conductive polymer layer. 123 is a transfer pad which is connected to an electrode leaf (not shown) for tab bonding to driving electronics. 123 is made of metal layer. 124 is the conductive epoxy which electrically connects 122 and 123. Thus, 122 can be connected to a driving electronics through 124 and 123. 125 is a liquid crystal layer. All metal layers and electrically conductive layers in FIGS. 6–9 can be replaced by the electrically conductive polymers according to the present invention.

THIN FILM TRANSISTOR DEVICES

The electrical contacts or electrodes in current thin film transistors (TFT) devices are metals. Metals deposited by an evaporative or sputtering process which requires expensive tooling. Suitable polymers include substituted and unsubstituted electrically conducting polyaniline polyparaphenylenes, polyparapheylenevinylenes, polythiophenes, polyfurans, polypyrroles polyselenophenes, polyisothianapthenes, polyphenylene sulfides, polyacetylenes, polyazines polypyridylvinylenes, combinations thereof and blends thereof with other polymers copolymers of the monomers thereof.

In order for these polymers to be used as a contact electrode in TFT they preferably have suitable electrical conductivity and be easily patternable. In addition, these polymers cannot outgas causing contamination of devices. Furthermore, the conducting polymers preferably are patternable by lithography. Patterning preferably does not result in a decrease in the conductivity polymer nor cause any deterioration of the properties of the conducting polymer.

It is therefore desirable to develop a method of patterning these polymers, ideally a method that can be used on any conducting polymer system and does not negatively impact properties of the conducting polymer.

The use of a conducting polymer electrode as at least one of the source and the drain in a TFT having a different-type conjugated polymer as the semiconductor layer has been described earlier (H. Koezuka, A. Tsumura, T. Ando, U.S. Pat. No. 5,107,308). In this patent the gate consistently comprised of a metal. Furthermore, whenever one of the drain electrodes in a TFT was a film of a conducting polymer, this film had a patterned metal lead. The method used for the growth of the conducting polymer was electrochemical polymerization. Although the authors of the above patent generally describe a different method can be used to form the conducting polymer electrode, they do not offer any solution to the problem of how to pattern the conducting polymer layer to the required shape of the source and/or the drain electrodes and form the transistor channel between the electrodes. In the present patent application we present devices that use conducting polymer one or more of the source, the drain and the gate electrodes of a TFT and ways to pattern a conducting polymer layer.

The present invention is also directed to TFT devices, in which one or more of the source, drain and gate electrodes comprise an electrically conducting polymer. FIG. 10 to 13 show configurations of TFT devices.

Figure 10:
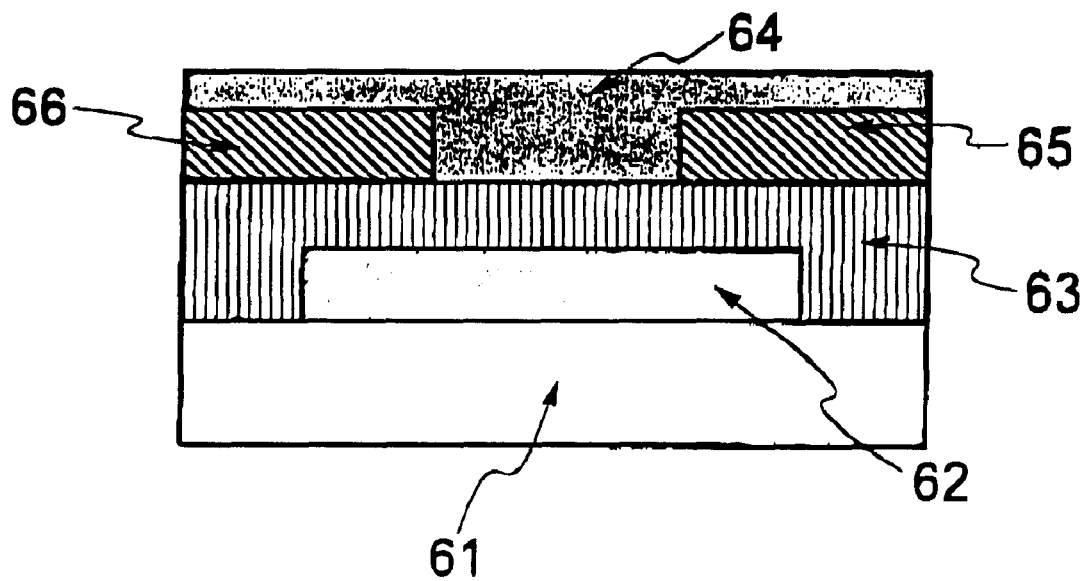
FIG. 10 shows a schematic of the cross section of a TFT in which one or more of the source drain, and the gate electrodes comprise a conducting polymer. The source and drain are disposed directly on top of the gate insulator and subsequently they are covered by the semiconductor.

FIG. 10 shows a device made on a substrate 61. A patterned conducting polymer gate electrode 62 is disposed on the substrate 61. An insulating layer 63 is disposed on top of the gate electrode 62. Source 65 and drain 66 electrodes comprising a conducting polymer were disposed and patterned on top of the gate insulator 63. The semiconductor layer 64 is disposed over the source 65 and the drain 66 electrodes and part of the gate insulator 63.

Figure 11:
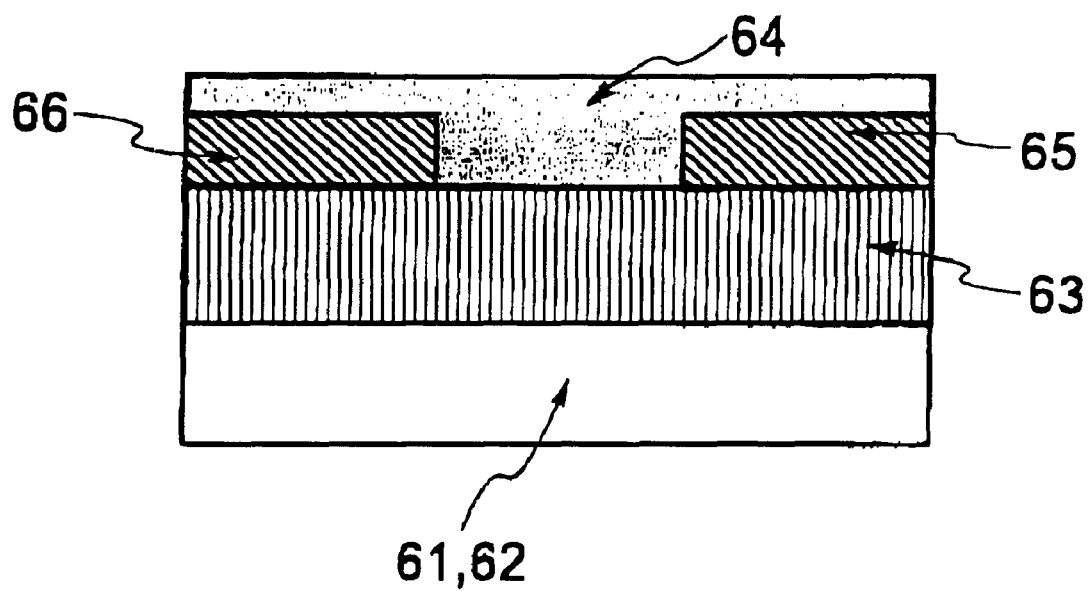
FIG. 11 shows a schematic of the cross section of a TFT in which one or more of the source and the drain electrodes comprise a conducting polymer. The substrate is conductive and used as the gate electrode too. The source and drain electrodes are disposed directly on the insulator and subsequently they are covered by the semiconductor.

FIG. 11 differs from FIG. 10 in that the substrate 61 is conductive and acts as the gate 61. A specific but not limiting example of this structure is to have a heavily doped wafer as substrate/gate electrode (61 and 62) and use a thermally grown oxide 63 as insulator on top of it. The rest of the layers remain as described in FIG. 10.

Figure 12:
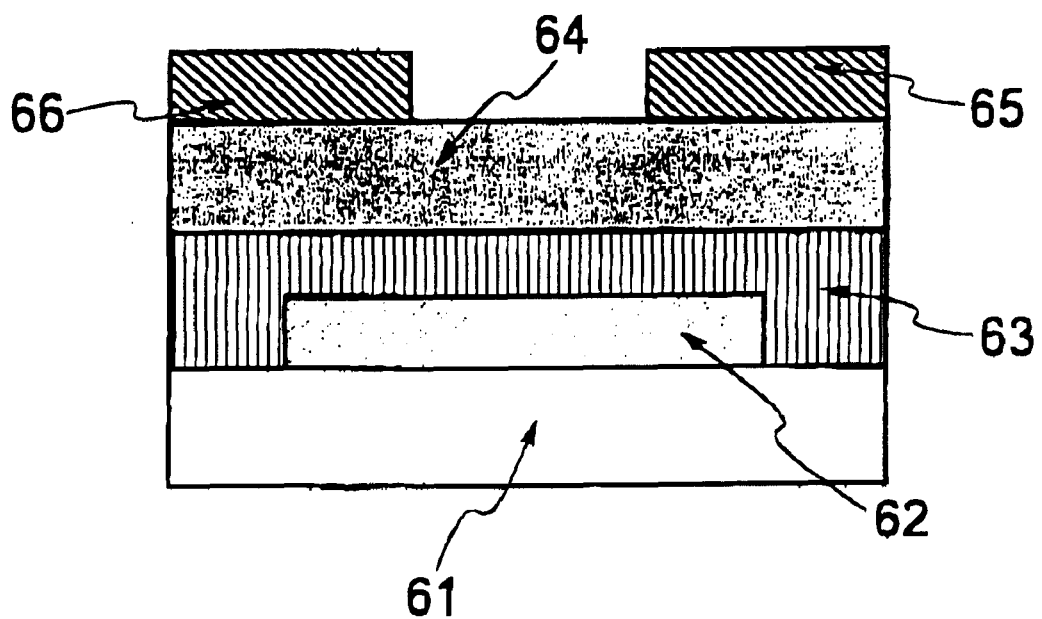
FIG. 12 shows a schematic of a cross section of a TFT in which one or more of the drain, and the gate electrodes comprise a conducting polymer. The source and drain electrodes are disposed directly on top of the semiconductor.

FIG. 12 differs from FIG.10 in that the source 65 and drain 66 electrodes are disposed on top of the semiconductor layer 64, which was earlier disposed on the gate insulator.

Figure 13:
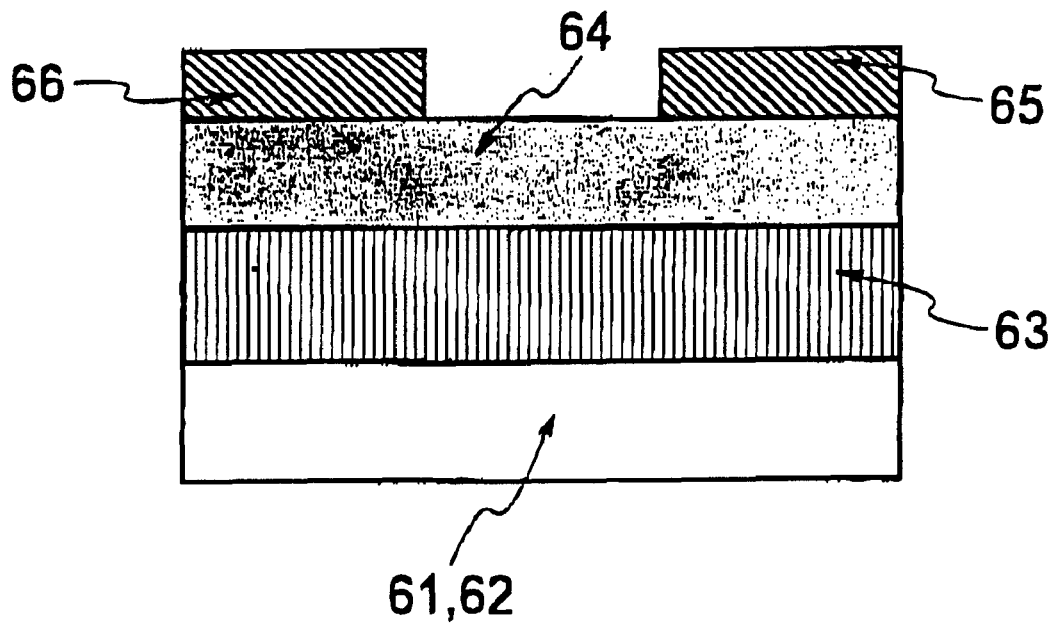
FIG. 13 shows a schematic of the cross section of a TFT in which one or more of the source and the drain electrodes comprise a conducting polymer. The substrate is conductive and used as the gate electrode. The source and drain electrodes are disposed directly on the semiconductor.

FIG. 13 differs from FIG. 11 in that the source 65 and drain 66 electrodes are dispose on top of the semiconductor layer 64, which was earlier disposed on the gate insulator.

Figure 14:
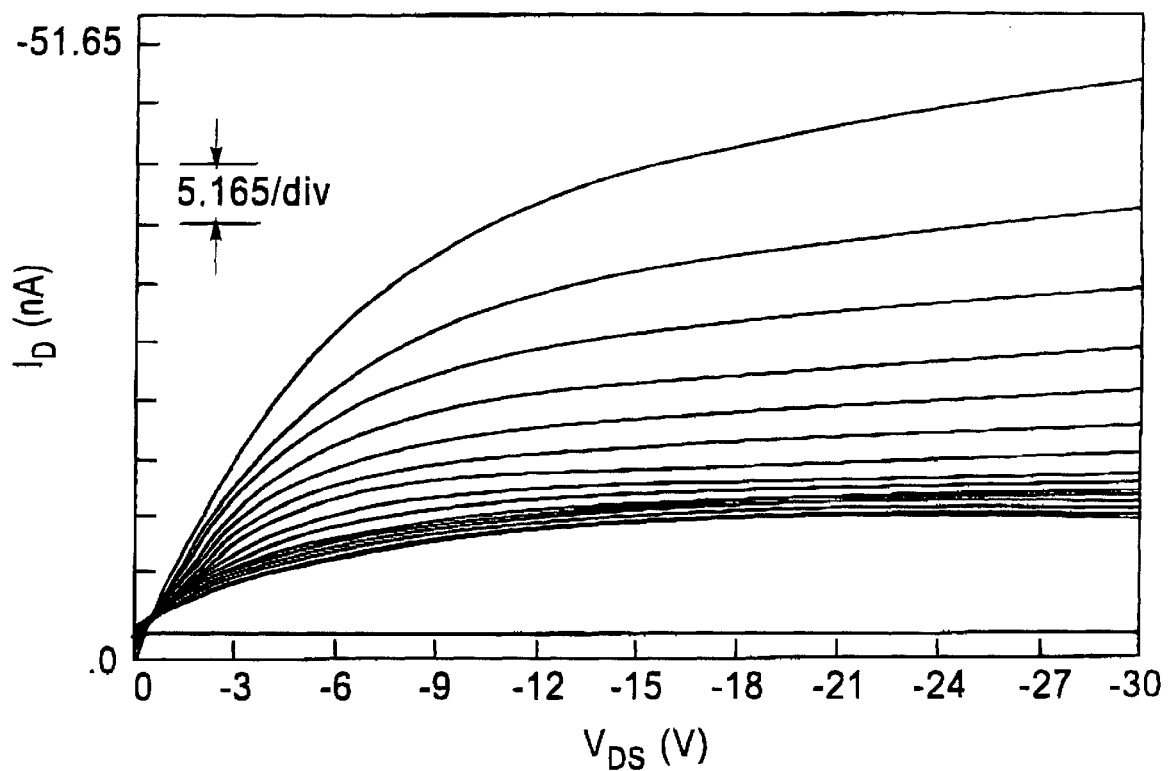
FIG. 14 shows a plot of the current flowing between the source and the drain of the TFT device, whose structure is schematically drawn in FIG. 11, versus the voltage gate electrode. The channel length, L, of this device was 100 microns and the channel width was 1500 microns.

FIG. 14 shows a plot of the current flowing between the source and the drain of the TFT device, whose structure is schematically drawn in FIG. 11, versus the voltage gate electrode. The channel length, L, of this device was 100 microns and the channel width was 1500 microns.

Figure 15:
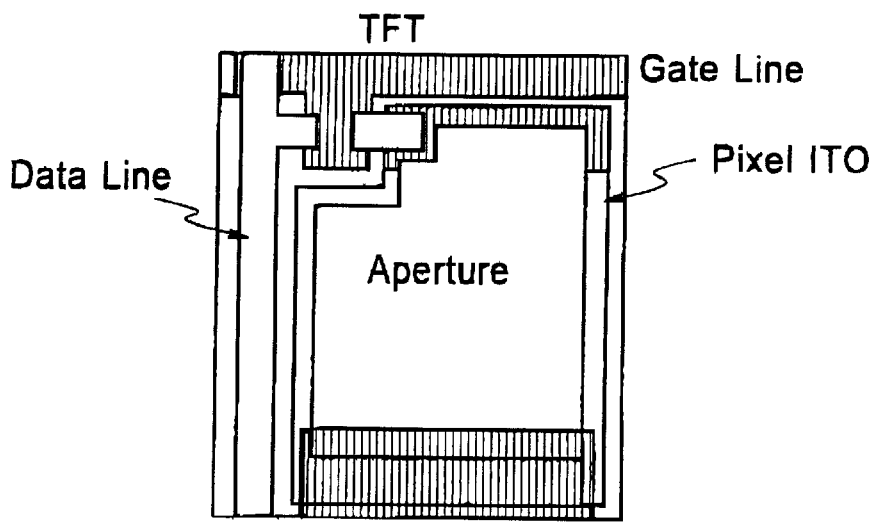
FIG. 15 shows the top view of a typical layout of a TFT based active matrix liquid display. One or more of the source, the drain, and the gate electrodes comprise a polymer.

FIG. 15 shows the top view of a typical layout of a TFT based active matrix liquid crystal display. One or more of the source, the drain, and the gate electrodes comprise polymer.

Figure 16B:
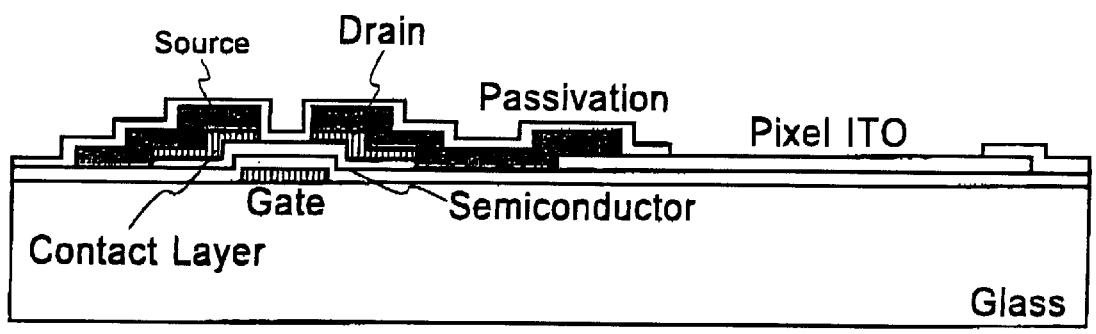
FIG. 16 shows cross sections of a pixel of a TFT based active matrix liquid crystal display having two different TFT configurations, FIG. 16(a) and FIG. 16(b). One or more of the source, the drain, and the comprise a conducting polymer.
Figure 16A:
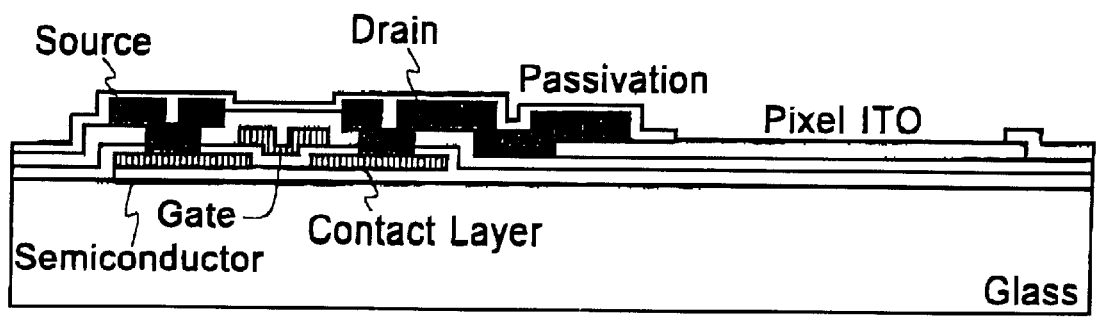

FIG. 16 shows cross sections of a pixel of a TFT based active matrix liquid crystal cell having two different TFT configurations, FIG. 16(a) and FIG. 16(b). One or more of the source, the drain, and the comprise a conducting polymer.

Figure 17:
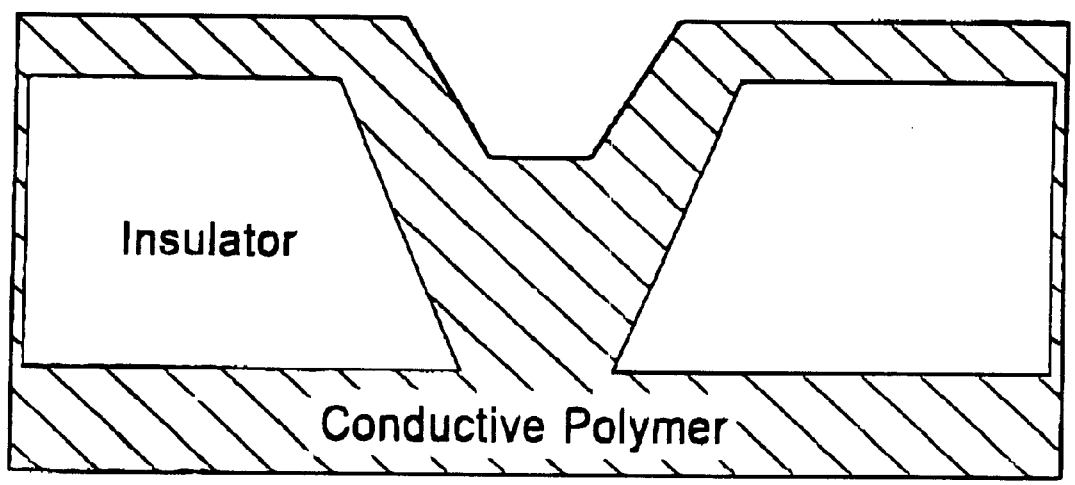
FIG. 17 shows contact via through a passivating or insulating layer. The bottom is a conducting polymer. The top layer could be either the same material or a different conducting material such as a metal, or ITO.

FIG. 17 shows contact via through a passivating or insulating layer. The bottom a conducting polymer. The top layer could be either the same or a different conductive material such as a metal, conductive polymer or ITO.

LED DEVICES

Patterned electrically conductive polymers are also useful to fabricate electroluminescent diodes. More particularly, this invention relates to a transparent cathode and anode structure for light emitting diodes (including organic light emitting diodes) which, when fabricated on transparent substrates, renders a display which is at least partially transparent and when fabricated on an opaque substrate containing devices and circuits renders a display viewable from the cathode side. The present invention applies to LEDs having an organic and an inorganic electroluminescent region. The invention will be described with reference to OLEDs but is not limited thereto.

Organic light emitting diodes (OLEDs) described in prior work were fabricated on glass substrates, and their lower electrode was the transparent conductor indium tin oxide (ITO). The top electrode for these devices was opaque so that light from the electroluminescent region could be viewed only from the glass side. One exception is the structure recently reported by V. Bulovic et al. in Nature 380, 29 (1996) in which the cathode metal is thinned during the subsequent ITO deposition and made partially transparent.

An OLED display on an opaque substrate or a transparent OLED display on a transparent substrate requires a top electrode structure that satisfies the following criteria to (1) be transparent to the LED emission, (2) provide a low series resistance current injection into the LED active region, (3) provide sufficiently high lateral conductivity on the plane of the electrode when these diodes are formed into two-dimensional arrays self-emissive displays, (4) act as a protective film to the chemically and physically delicate underlying organic film, and (5) be able to be deposited in a benign fashion without damaging the organic layer on which it is deposited so that the integrity of the layer/electrode interface is preserved. The common transparent electrode material is indium tin oxide (ITO), often used as an anode in OLEDs, satisfies requirements 1–4, but it is typically deposited in an oxygen plasma ambient that causes damage to the organic region in the OLED device structure and therefore does not satisfy (5). The same is true for GaN as an electrode. Criterion (5) is actually the most crucial since, although there are several transparent conductive materials, nearly all involve plasmas or high processing temperatures which irreversibly damage the organic light emitting material.

What is needed is a transparent cathode and/or anode structure that is convenient to make and satisfies all of the above requirements.

It is therefore desirable to develop new electrode materials that offer a simpler process than ITO but at the same time offer high optical transmission, good conductivity environmental and thermal stability, and ease of patterning by lithography.

A typical light emitting diode configuration consists of a hole injecting electrode, an electroluminescent layer and an electron injecting electrode. This is the basic configuration. Sometimes hole transport layers can be incorporated between the injecting electrode and the electroluminescent layer to enhance the mobility of the holes and to isolate the holes. Also, an electron transport layer can be included between electroluminescent layer and the electron injecting electrode.

The electroluminescent layer can be an organic conjugated polymer, an organic small molecule such as the AlQ materials or it can be an inorganic material such gallium arsenide. Typical hole injecting electrodes include ITO. Typical electron injecting electrodes include aluminum, calcium, etc.

P-doped electrically conductive polymers according to the present invention can be used as hole injection layers and M-doped electrically conductive polymers according to the present invention can be used as electron injection layers.

Figure 18:
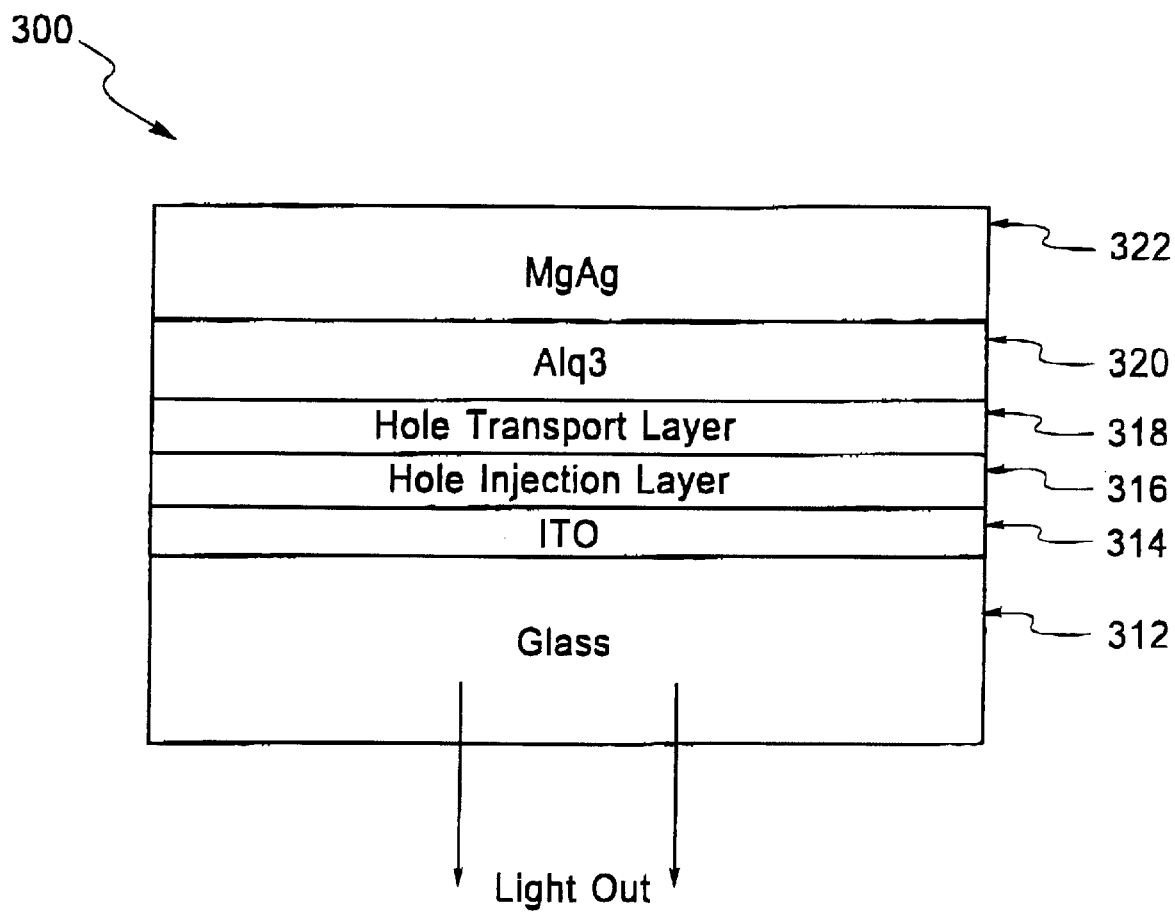
FIG. 18 shows a prior art OLED structure on a glass substrate with an opaque cathode on top wherein light is emitted from the glass side only.

An example of the structure of a prior art OLED 300 is shown in FIG. 18. The substrate 312 is glass, and an ITO film 314 is deposited directly on the glass and to form an anode. For efficient operation the organic region commonly consists of layers and shown in FIG. 18 are a hole injection layer 316, a hole transport layer 318 and electroluminescent (EL) layer 320. EL layer 320 is the metal chelate tris(8-hydroxyquinoline) aluminum, (sometimes abbreviate S or Alq3). The hole transport layer in this configuration is an aromatic diamine. The metal alloy MgAg is deposited on top of the organics to form a cathode 322 which is opaque for thicknesses greater than approximately 10 nm. Not shown is a hermetic seal that is sometime used to protect the cathode from moisture.

The EL layer in the structure of FIG. 18 is a member of the class of organic materials known as molecular organics. These are serially deposited by an evaporation process. Polymers form another class of organic materials exhibiting electroluminescence and are usually applied by spin coating. Polymer OLEDs are also commonly made on glass substrates using an ITO anode and have an opaque cathode (usually a low work function metal such as calcium) so that light is emitted from one side only. They may also employ multiple polymer layers to improve operating efficiency.

Figure 19:
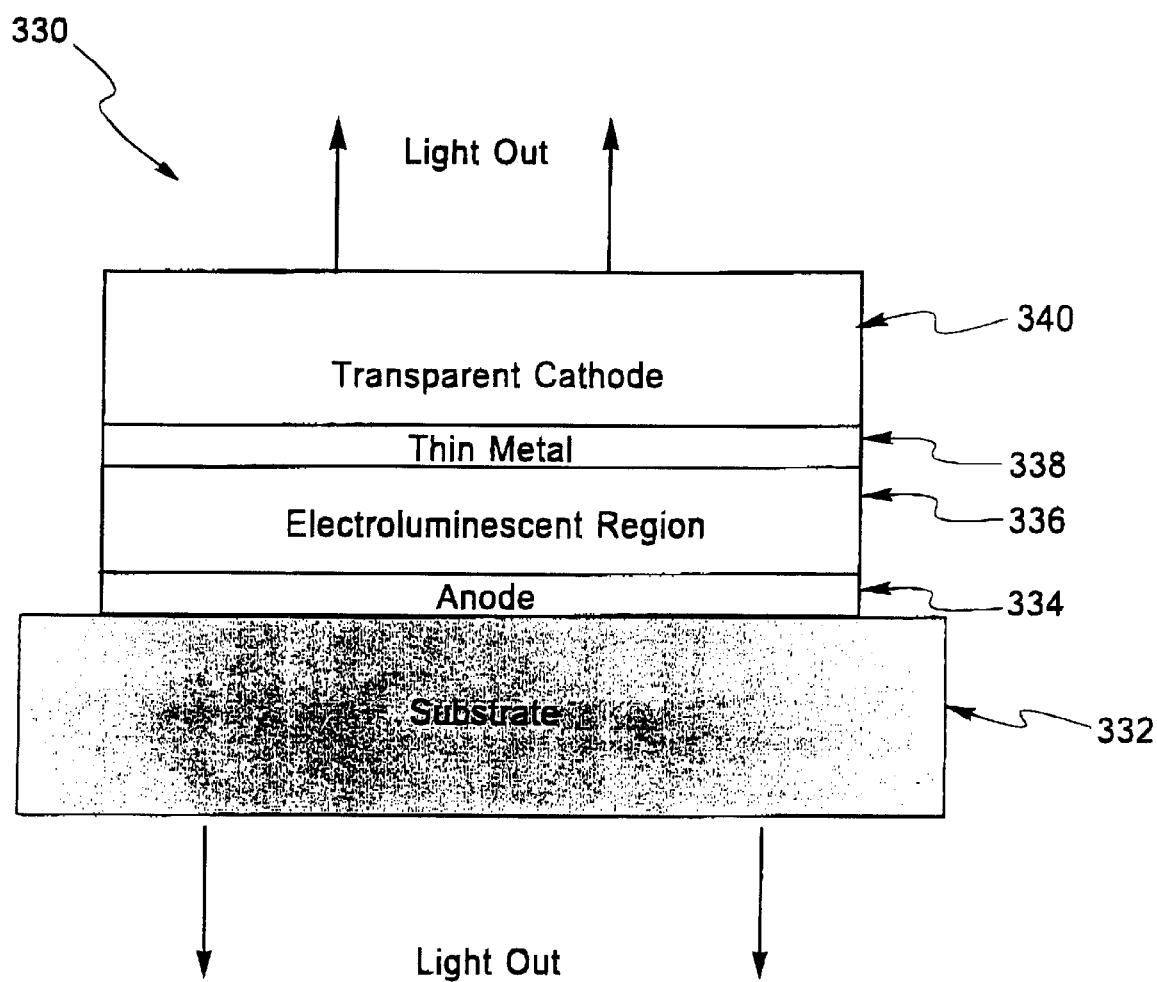
FIG. 19 generally shows an LED structure of the present invention with a transparent (or opaque) cathode.

An exemplary embodiment of the LED of this invention is an OLED having a transparent cathode 340 which is depicted by the general structure in FIG. 19. If the OLED is formed on a glass substrate 332 or plastic substrate with an ITO (or electrically conductive polymer) anode 334, light is now emitted from both sides, and the OLED is at least partially transparent. A viewer looking at a display consisting of an array of such OLEDs could either focus on the image presented on the display or could look through the display at the scene beyond. On the other hand a display formed on an opaque substrate, such as silicon, and using OLEDs with a transparent cathode could be viewed by looking at the light emitted from the cathode side. Fabricating an OLED display on silicon is advantageous because the devices and circuits can be formed in the silicon prior to depositing the OLED on the silicon, and the devices and circuits can be used to make an active matrix display with integrate drivers.

According to the present invention the anode or cathode of the LED can be formed from or covered by a protective layer of an abrasion and scratch resistant electrically conductive polymer as incorporated by reference herein. Light emission from an OLED having the cross section shown in FIG. 19 is from both the top and the bottom (i.e., from both sides of the diode) since both anode and cathode are transparent.

The electrically conductive polymers described herein provide a satisfactory cathode electrode by meeting the requirements of transparency, perpendicular conduction for low series resistance, formation of a protective film and a damage free deposition process. Abrasion and scratch resistant electrically conductive polymers are described in U.S. patent application Ser. No. 08/193,926 filed Feb. 9, 1994 now U.S. Pat. No. 5,721,299 and U.S. patent application Ser. No. 08/476,141 filed Jun. 7, 1995 pending both entitled, "Electrically Conductive and Abrasion/Scratch Resistant Polymeric Materials, Method of Fabrication and Uses Thereof", the teaching of which is incorporated herein by reference. Below each requirement is considered individually.

A display device is formed by fabricating many identical OLEDs on a monolithic substrate arranged into a two-dimensional array and providing the means of controlling the light emission from each diode. Generally, the image is formed a line at a FIG. 20A (passive matrix approach), for example, the selected row line 490 is brought to a positive voltage Vr while all unselected row lines 492 remain at ground. A voltage is applied to each column line 494, 496 where i is the column line index and runs from the maximum number of column lines. The forward bias on OLEDs 498, 400 along the selected row line 490 is then Vr−Vci and this voltage determines the amount of emitted. All other OLEDs 402, 404 are reverse biased and emit no light.

Figure 20A:
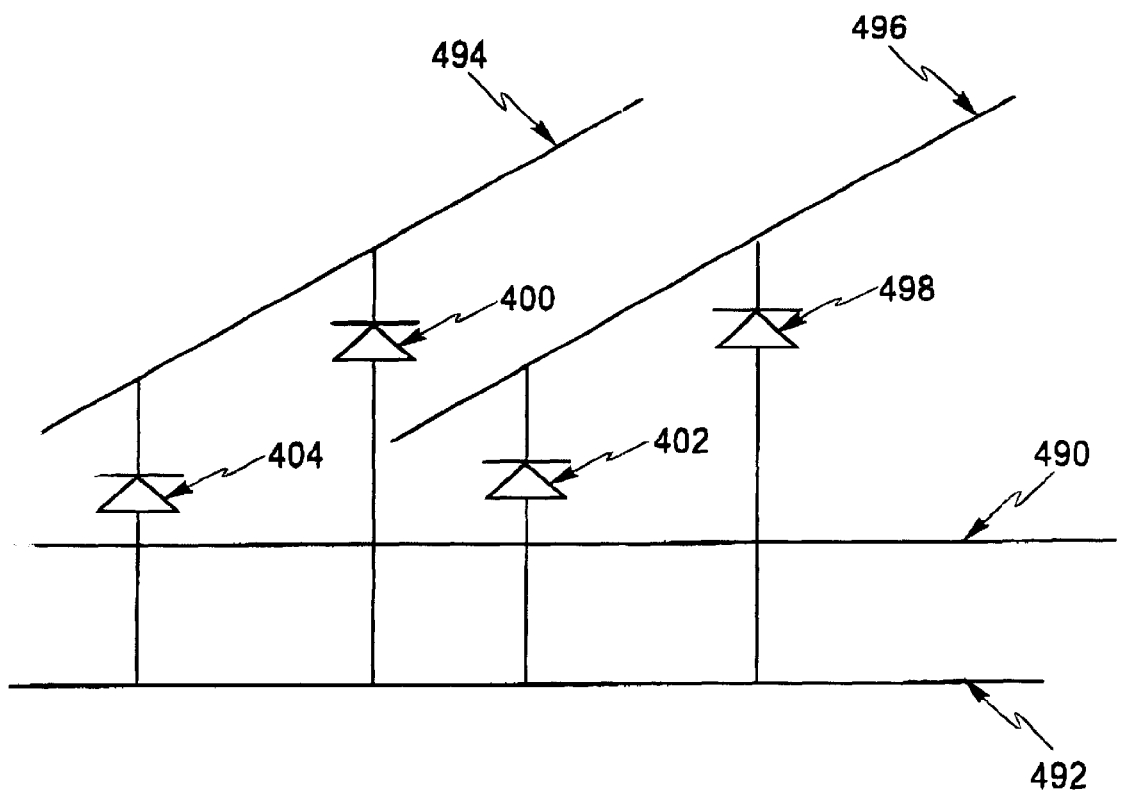
FIG. 20 shows schematically LED arrays for displaying an image with FIG. 20A that of a passive matrix having an LED at the crosspoint of each row and column and FIG. 20B being that of an active matrix with a current regulating circuit at the crosspoint of each row and column line.
Figure 20B:
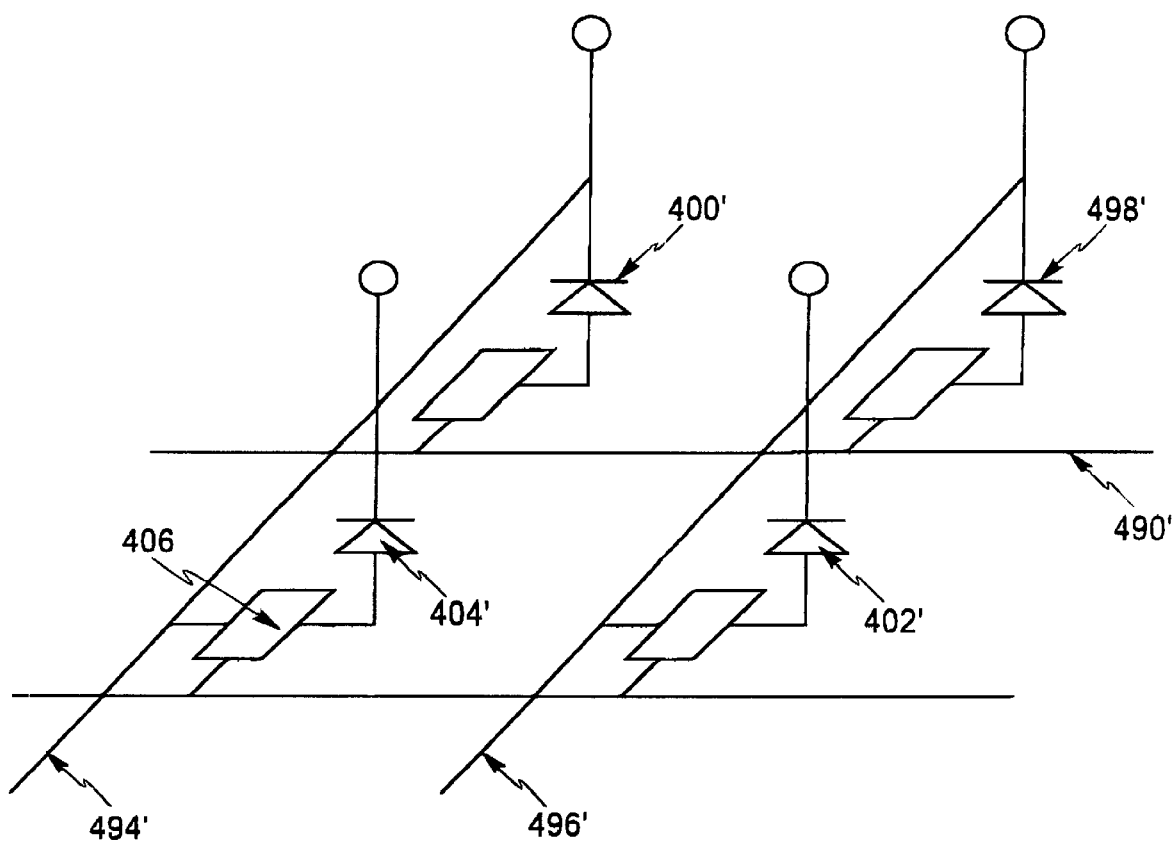

For the array shown in FIG. 20A, an OLED emits light only when its row line accessed and this can produce flicker in high information content displays. This is remedied by the array shown in FIG. 20B (active matrix approach) where a circuit included at each cross point is used to sample the column line voltage and hold the other row lines are accessed. In this case all diodes share a common cathode. Because these circuits need to be small and fast, it is convenient to fabricate single crystal silicon. In this second case, the substrate is opaque and a transparent cathode is required to view the image.

References cited herein are hereby incorporated herein by reference. U.S. patent application Ser. No. 08/794,072 filed on Feb. 4, 1997 now U.S. Pat. No. 5,739,545 assigned to the assignee of the present invention describes OLED structures and methods of fabrication, the teaching of which is incorporated herein by reference.

METHODS OF PATTERNING

To be able to be used as a electrode or electrical contact, the electrically conducting polymer is preferably patterned. A number of methods are described herein which can be used to pattern the various electrically conductive polymers.

These include an application of a resist material to the surface of the conducting polymer. The resist can be negative or positive type and can be developed in aqueous or organic solvents. Examples of negative resists are polymethylmethacrylate type, novolak/diazonaphthaquinone systems, t-boc protected styrene polymers and copolymers thereof, t-butyl protected styrene polymers and copolymers thereof, t-butyl protected styrene polymers and copolymers thereof, other acid liable deprotected acrylate ester polymers and copolymers thereof. These are exemplary only and not limiting. Examples of positive resists are epoly containing polymers, hydroxystyrenr polymers with cross-linkers, and siloxane polymers. These are exemplary only and not limiting.

Figure 21:
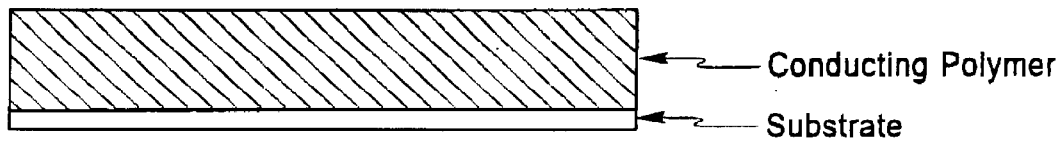
FIG. 21 depicts the patterning of conducting polymers by the application of a resist on the surface of the conducting polymer. The resist is exposed and developed; the pattern is transferred to the conducting polymer; the resist is removed.
Figure 21:
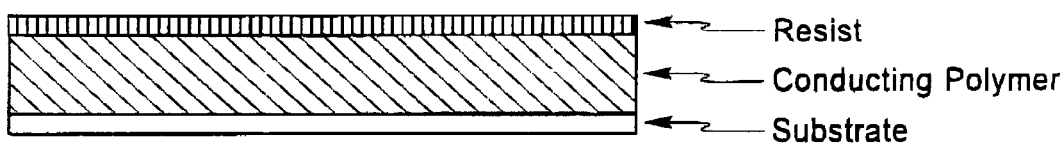
Figure 21:
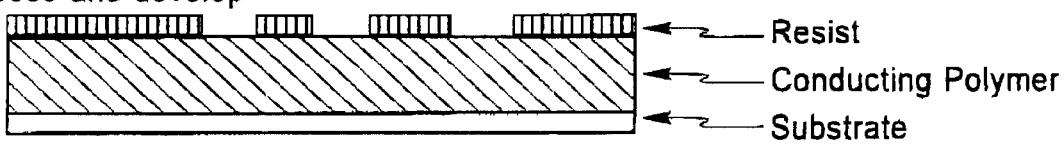
Figure 21:
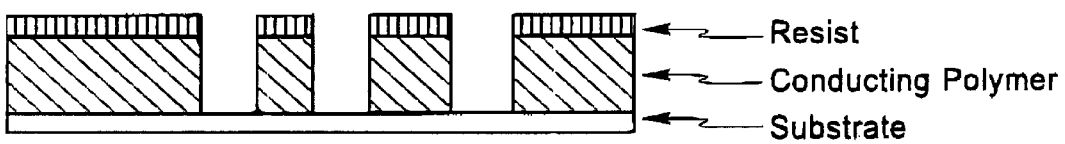
Figure 21:
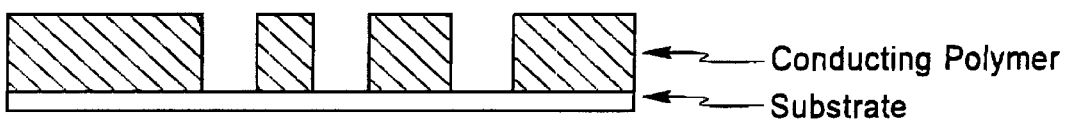

The resist is exposed to a given radiation, such as ultraviolet/visible electron-beam x-ray and ion beam aqueous tetramethyl ammonium hydroxide aqueous tetramethyl ammonium hydroxide, aqueos NaOH, aqeous KOH, methylisobutyl ketone, aqueous tetraethylammonium hydroxide, isoprpanol, propylene, glycole methyl ether acetate, diglyme, methyl ethyl ketone and These are exemplary only and not limiting. The resist image is subsequently transferred to the conductive polymer by reactive ion etching (RIE) such as with oxygen gas, $Co_2$, $SO_2$, fluorine, etc. Once the image is transferred to the conducting polymer, the remaining resist is removed, preferably by a solvent wash acetone, diglyme, isopropanol, etc. This scheme is outlined in FIG. 21. It is desirable that the solvent used to apply the resist as well as the developer of the resist and conditions under which the resist is developed, and the solvent which is used to remove the resist, does not result in the deterioration of the conducting polymer's properties such as the conductivity, o transmission, thermal stability, and so on.

Figure 22:
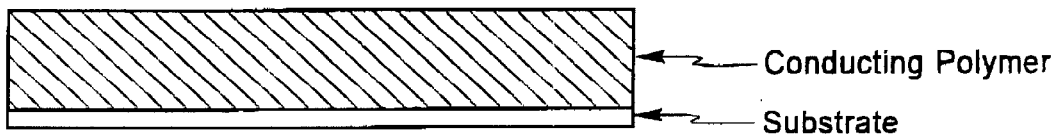
FIG. 22 depicts the patterning of conducting polymers by the application of a patterned metal layer on the conducting polymer via a metal mask. The pattern is transferred to the conducting polymer followed by removal of the metal.
Figure 22:
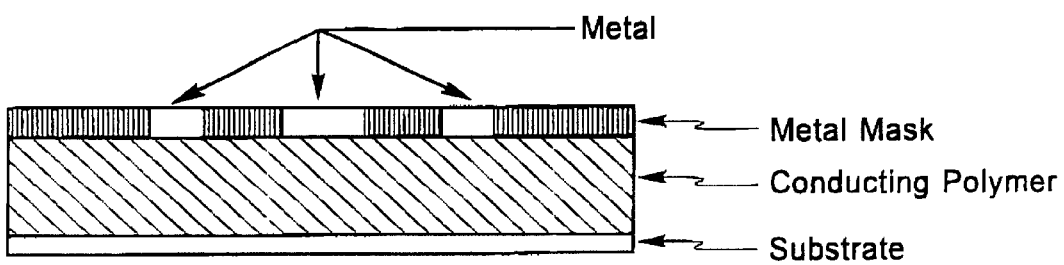
Figure 22:
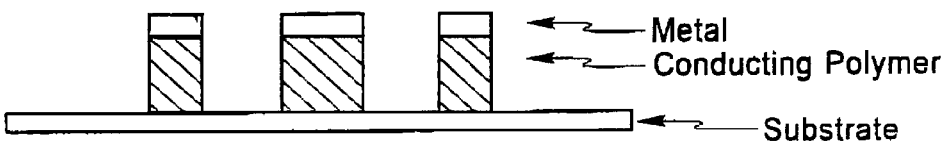
Figure 22:
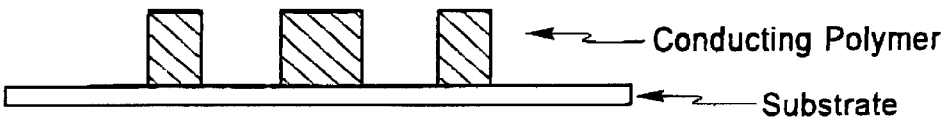
Figure 23A:
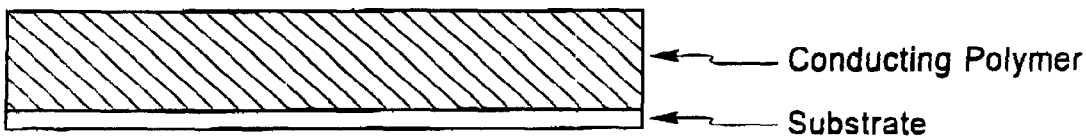
FIG. 23 depicts the patterning of conducting polymers by the application of a blanket metal layer on the conducting polymer. The metal is patterned by a resist; the pattern is transferred first to the metal and then to the conducting polymer by etching; the remaining resist and metal are removed.
Figure 23A:
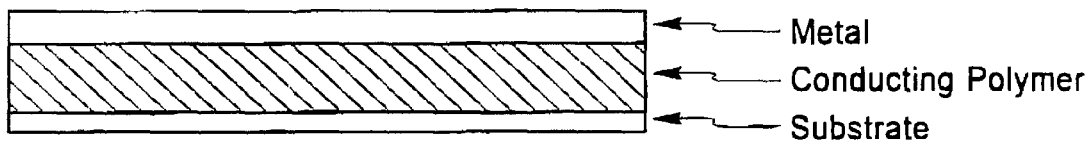
Figure 23A:
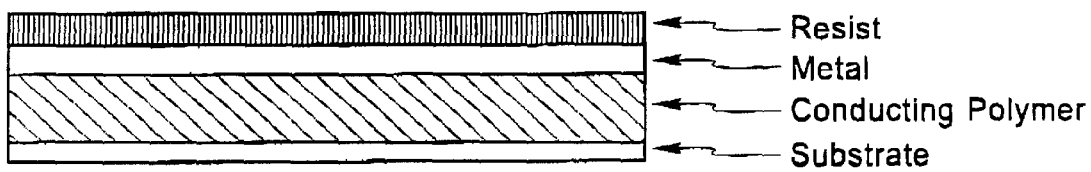
Figure 23A:
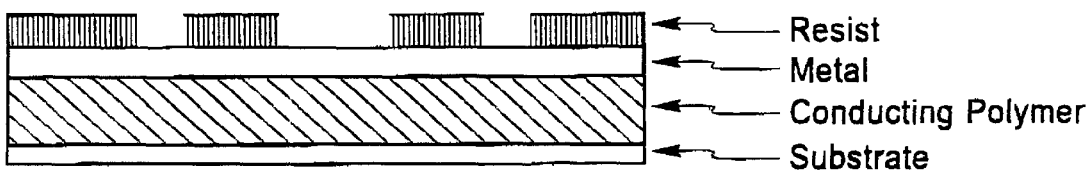
Figure 23A:
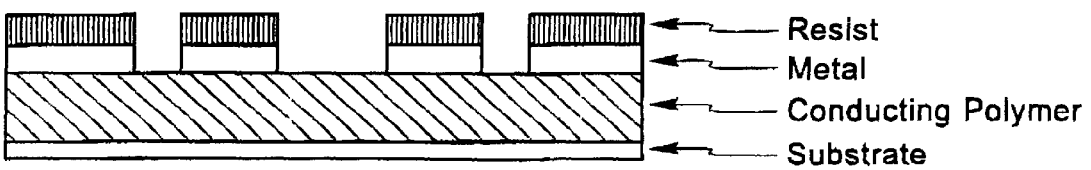
Figure 23B:
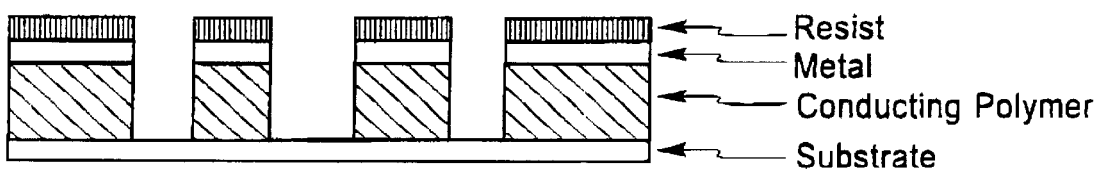
Figure 23B:
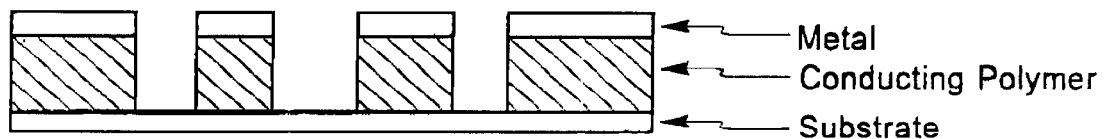
Figure 23B:
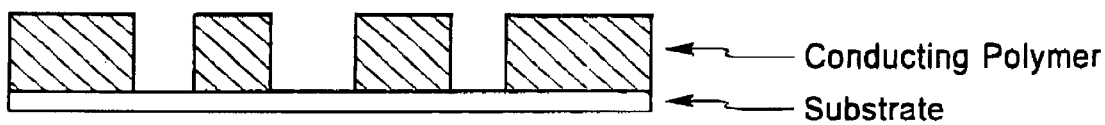

A second method of patterning the conducting polymer is with the deposition of a metal such as aluminum, gold, etc. on the surface of the conducting polymer. A patterned metal layer is deposited on the conducting polymer by depositing the metal through a metal mask The pattern is then transferred to the conducting polymer by etching such as by oxygen gas $CO_2$, $SO_2$, fluorine, etc. RIE. The metal is then removed by etching with an acid solution such as hydrochloric acid, hydrofloric acid, acitic acid, sulfuric acid, perchloric acid, phosphoric acid, nitric acid and any combinations thereof. This scheme is depicted in FIG. 22. It is desirable that the conditions under which the metal is deposited and etched does negatively impact the properties of the conducting polymer.

A third method of patterning the conducting polymer is with the deposition of blanket metal, such as aluminum, gold, etc. on the surface of the conducting polymer. The metal is patterned by the application of a resist. A the resist is exposed to radiation, such as ultra-violet, visible, electron beam, x-ray, ion-beam and developed, using similar developers described above, the pattern is transferred to the metal layer by etching the metal, for example, with an acid solution such as described above. The pattern then transferred to the conducting polymer, for example, by oxygen, $CO_2$, $SO_2$, fluorine, etc. reactive ion etching. This is followed by removal of the resist by a solvent followed by removal of the metal by an acid etch, similar to these described above. This scheme is illustrated in FIG. 23. It is desirable that of the above processing steps and solvents used in these steps do not adversely affect properties of the conducting polymer.

Figure 24:
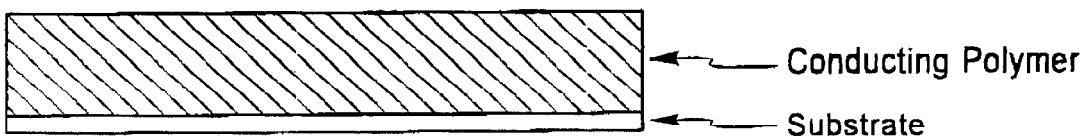
FIG. 24 depicts the patterning of a conducting polymer directly by exposing it to radiation; the polymer is subsequently developed to remove the more soluble regions.
Figure 24:
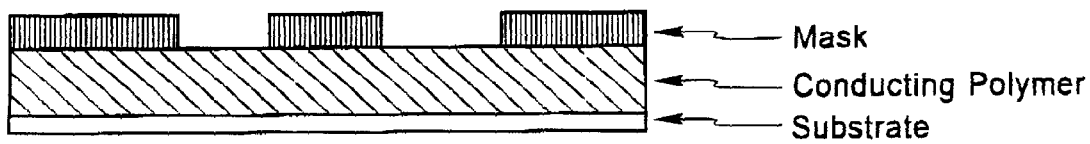
Figure 24:
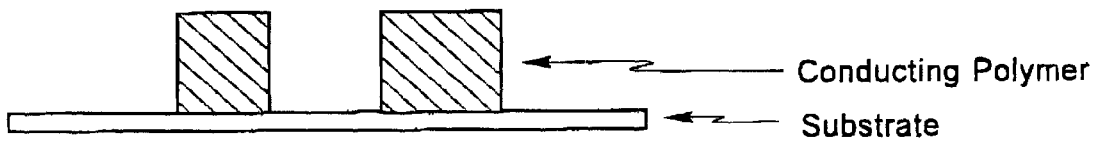

A fourth method of patterning the conducting polymer is by direct exposure to radiation. The conducting polymer is radiation sensitive and results in a solubility difference between exposed and unexposed regions upon irradiation. The radiation can be electron beam, ion beam, and electromagnetic radiation (for example, x-rays and light). In this case the more soluble region exposure are removed by a solvent wash thus resulting in direct conducting polymer patterns. This scheme is depicted in FIG. 24 and as described in U.S. Pat. No. 5,198,153, the teaching of which is incorporated herein by reference.

In all of the above cases, the exposure to radiation can include electromagnetic radiation, such as x-rays, and light of various wavelengths and include charged uncharged particle beams such as electron beams, ion beams, and elementary particle beams.

Figure 25:
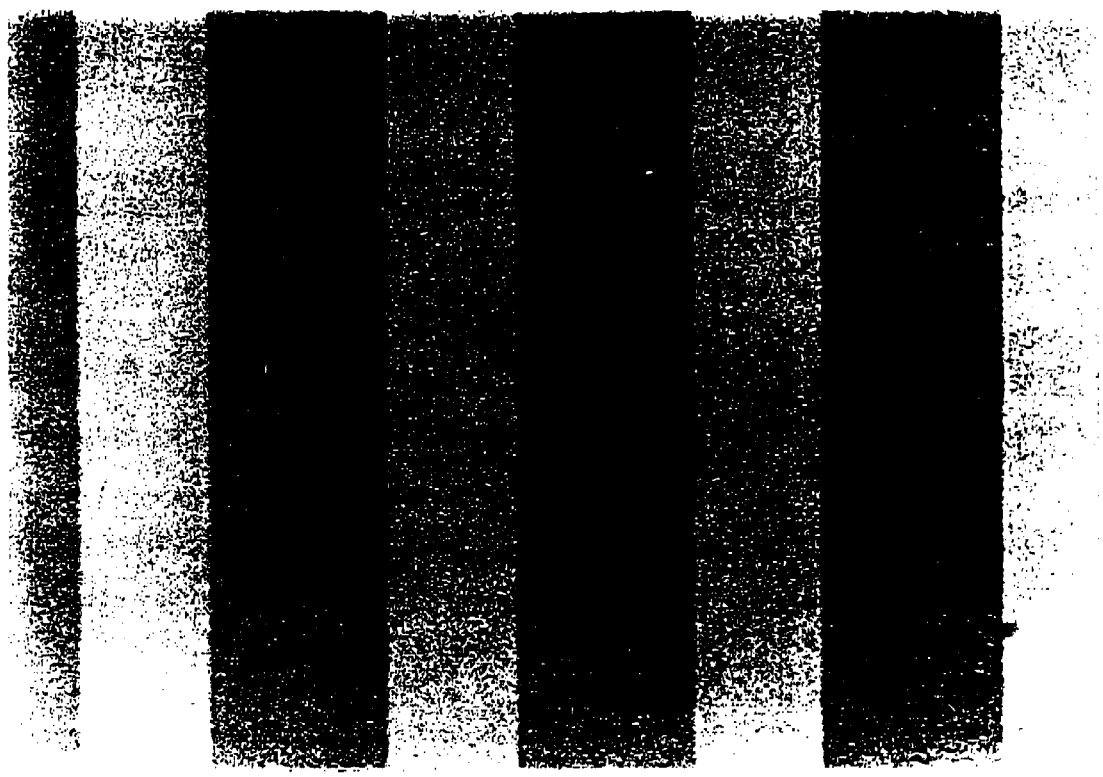
FIGS. 25 and 26 depict conducting polyaniline lines on the order of 10 &mu.m delineated with the use of a resist on the surface of the conducting polymer.
Figure 26:
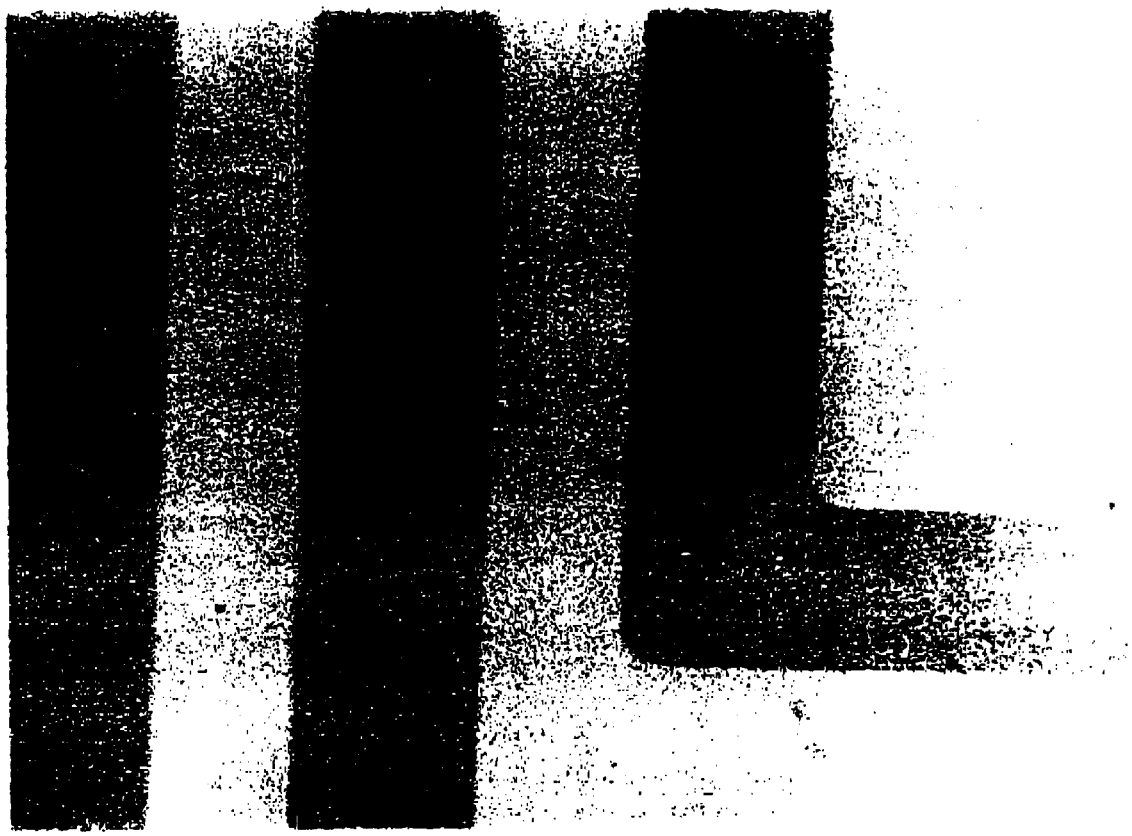

Specific Examples follow:

1. Polyaniline doped with acrylamidopropanesulfonic acid described in U.S. application Ser. No. 08/595,853 filed on Feb. 2, 1996, now U.S. Pat. No. 6,193,909, the teaching of which is incorporated herein by reference was spin applied on to a glass substrate from a suitable solution including N-methylpyrrolidinone, m-cresol, dimethylpropylene urea, dimethylsulfo dimethylformamide, etc. The thickness of the coating can be controlled by the concentration of the polymer in solution as well as by the spin speed. Generally a 0.1% to 5% solution was utilized of the polymer in a given solvent. The thickness of the coating ranged from 500 to 1000 Angstroms. The conductivity of the film ranged from 1 to 150 S/cm. The coated film was baked in an oven at 85° C. for 5 minutes to remove residual solvent. On to this polyaniline surface was applied a conventional Shipley photoresist (MP 1808). The resist is baked at 85° C. for 30 minutes The resist coated polyaniline substrate was then exposed to ultra-violet light at a dose of 70 mj. The resist was subsequently developed in an aqueous alkaline Micropos CD-30 developer. As the developer which is alkaline can dedope the polyaniline and render the polyaniline less conducting, it is desirable that the developer and time of development be closely controlled. In this case, the developer concentrate is diluted with deionized water by 50%. The resist was developed for 30 seconds followed by a rinse with water. The developed resist is then cured at 100° C. for 30 minutes to harden the resist prior to image transfer. The resist image was then transferred to the polyaniline by oxygen reactive ion etching. The polyaniline was etched using 150 watts RF power load, 100 mtorr pressure and 20 sccm of oxygen gas in a reactive ion etching chamber for 2 minutes. After the image was transferred, the remaining photoresist was removed by washing with acetone. 10 &mu.m conducting polyaniline lines imaged in this fashion are shown FIGS. 25 and 26. The conductivity of the polyaniline patterns was measured and found to be similar to the starting conductivity. In other words, no significant decrease in conductivity is attained as a result of this process. Other properties including the optical transmission and thermal stability and overall environment chemical stability were also evaluated and are discussed below.

2. Poly(3-butylthiophene-2,5-diyl) was dissolved in a suitable solvent such as tetrahydrofuran, methyl ethyl ketone, N-methyl pyrrolidinone, etc and spin coated on a glass plate. The polythiophene was then doped by exposing the film to a chamber of iodine. The doped sample was then pumped under dynamic vacuum. A conductivity of 1000 to 2000 S/cm was attained. This film was patterned by applying the Shipley photoresist MP 1808 as described above for the polyaniline.

3. Poly(3-hexylthiophene-2,5 diyl) was also dissolved, coated, and doped in the manner stated above and patterned as described in example 1.

4. Poly(3-octylthiophene-2,5 diyl) was treated and patterned as described above.

5. Polypyrrole was deposited on a glass plate as follows. Pyrrole monomer (0.045M) was dissolved in 500 ml of water. In a second beaker was dissolved the oxidant $FeCl_3$ (0.105 M) in 500 ml of water. (0.105M) of 5-sulfosalicyclic acid and (0.105M) of anthraquinone-2-sulfonic acid sodium salt are then added to the oxidant solution. A glass plate which had one side masked was dipped into the monomer solution. The oxidant solution is then added to the monomer solution. The solution is allowed to reach for 10 to 30 minutes to allow the polymerization of the monomer to proceed and deposit on the glass plate. The thickness of the conducting polypyrrole that deposits on the glass plate depends on the time the glass plate is allowed to sit in the polymerization bath. The polypyrrole had conductivity on the order of 200 S/cm. The polypyrrole deposited on the glass plate was then patterned by applying a resist as described above.

Figure 27:
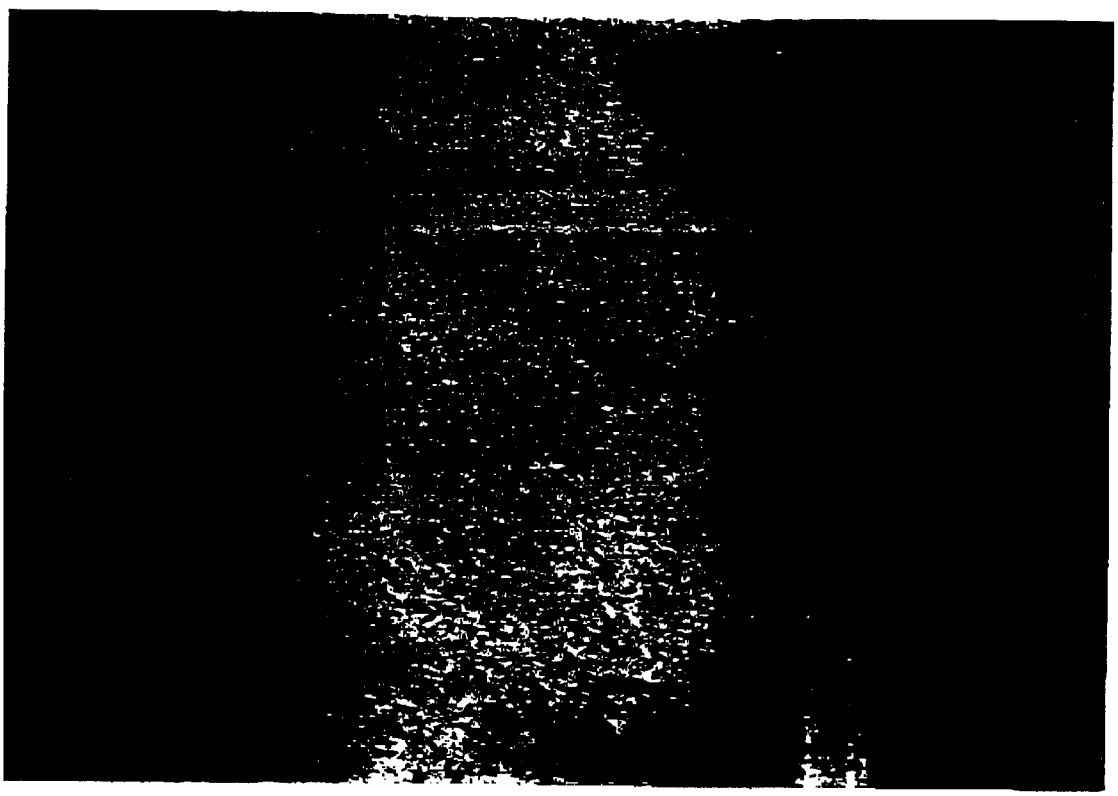
FIGS. 27 and 28 show conducting polyaniline lines fabricated with the use of metal deposited on the surface of the conducting polymer through a metal mask.
Figure 28:
Figure 29:
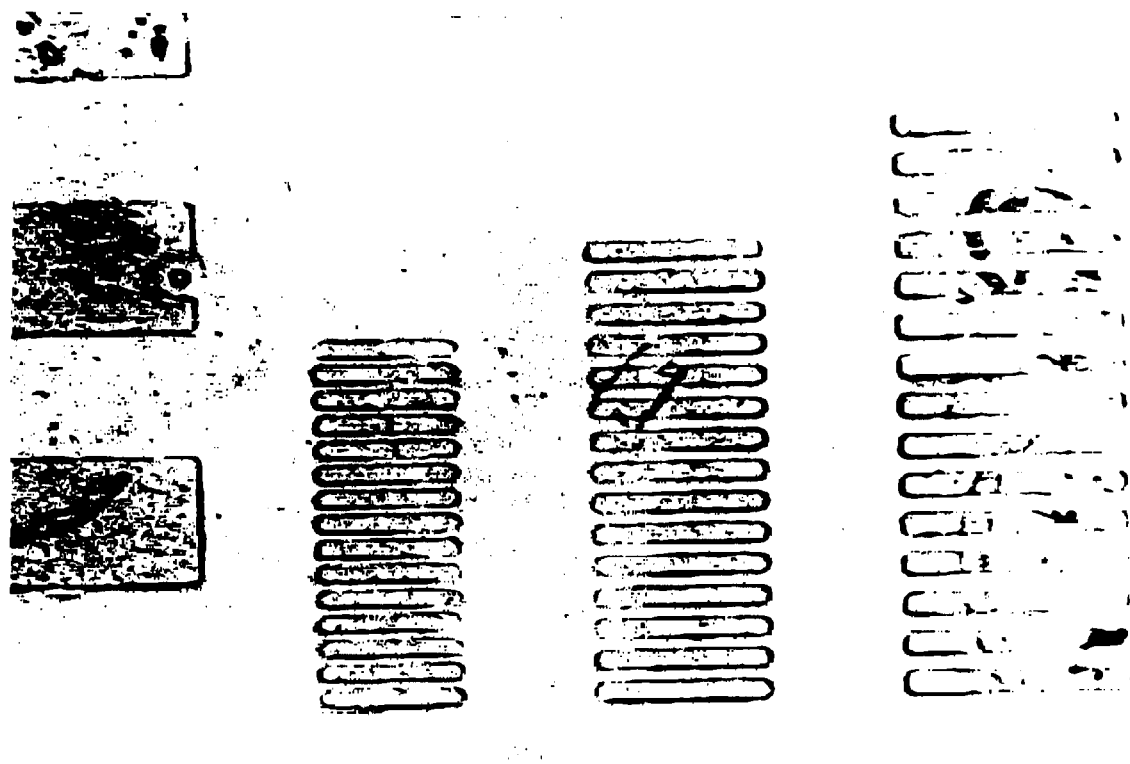
FIGS. 29, 30 and 31 depict conducting polyaniline lines fabricated with the use of blanket metal deposited on the surface of the conducting polymer which was imaged with the use of a resist.

6. Polyaniline doped with acrylamidopropanesulfonic acid was spin-applied on to glass plate. 300 Angstroms of blanket aluminum was evaporated on the polyaniline 2.0 &mu.m thick of a Shipley polypropylene glycol ether acetate solvent based resist was applied on the aluminum. The resist was exposed to ultra-violet light at a dose 50 mj and subsequently developed with a 50/50 mixture of Microposit developer concentrate and deionized water. After developing, the resist is baked at 85° C. for 30 minutes. The pattern is then transferred to the aluminum by etching the aluminum at room temperature using Transene aluminum etch solution consisting of 80% phosphoric acid, 5% acetic acid, 5% nitric acid, and 10% water. The etch rate w 4.19 Angstroms/sec. The pattern is in turn is transferred to the polyaniline by oxygen reactive ion etching using 20 sccm of oxygen at 100 mtorr pressure and 150 watts power load at an etch rate of 39 Angstroms/sec. An alternative method to transferring the pattern to the polyaniline is to carry out the aluminum etch at 30° C. At elevated temperature, both the aluminum and the polyaniline are etched by the acid solution at a rate of 37 Angstroms/sec. The remaining resist is removed by an acetone rinse. The remaining aluminum is etched away using a dilute 25% dilute hydrochloric acid solution. FIGS. 27, 28, and 29 depict conducting polyaniline patterned in this fashion.

7. The substituted polythiophenes and in-situ polymerized polypyrrole described were also patterned using aluminum blanket metal as described for the polyaniline above.

Figure 30:
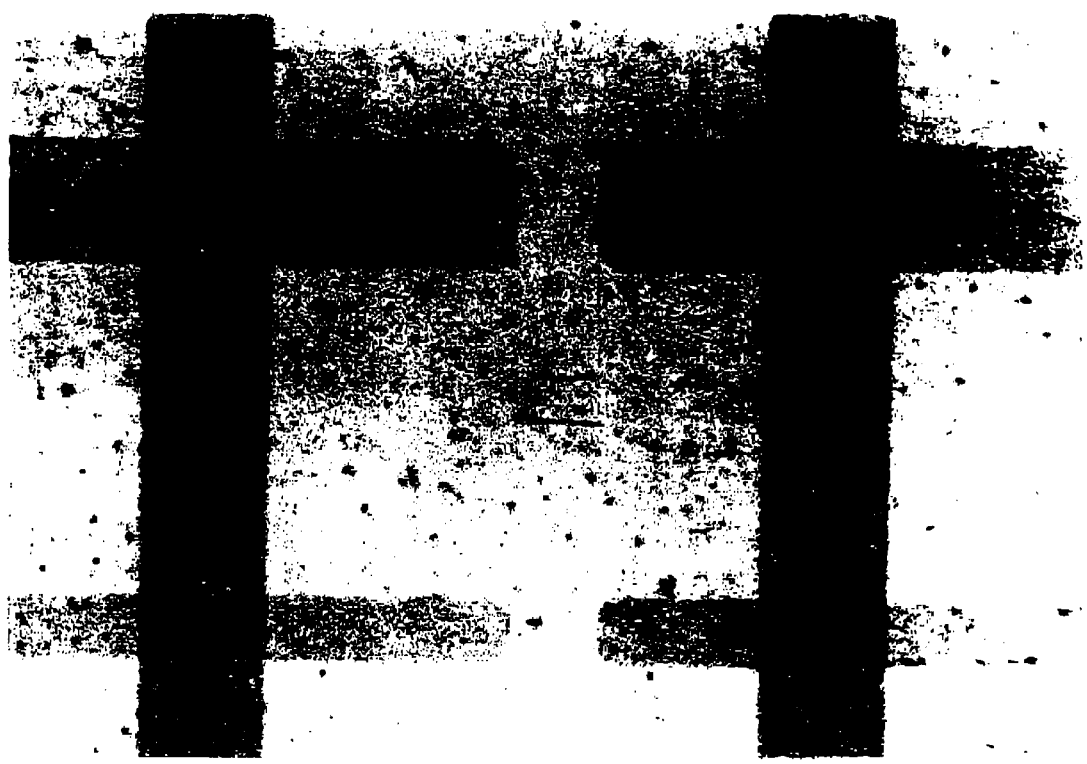
Figure 31:
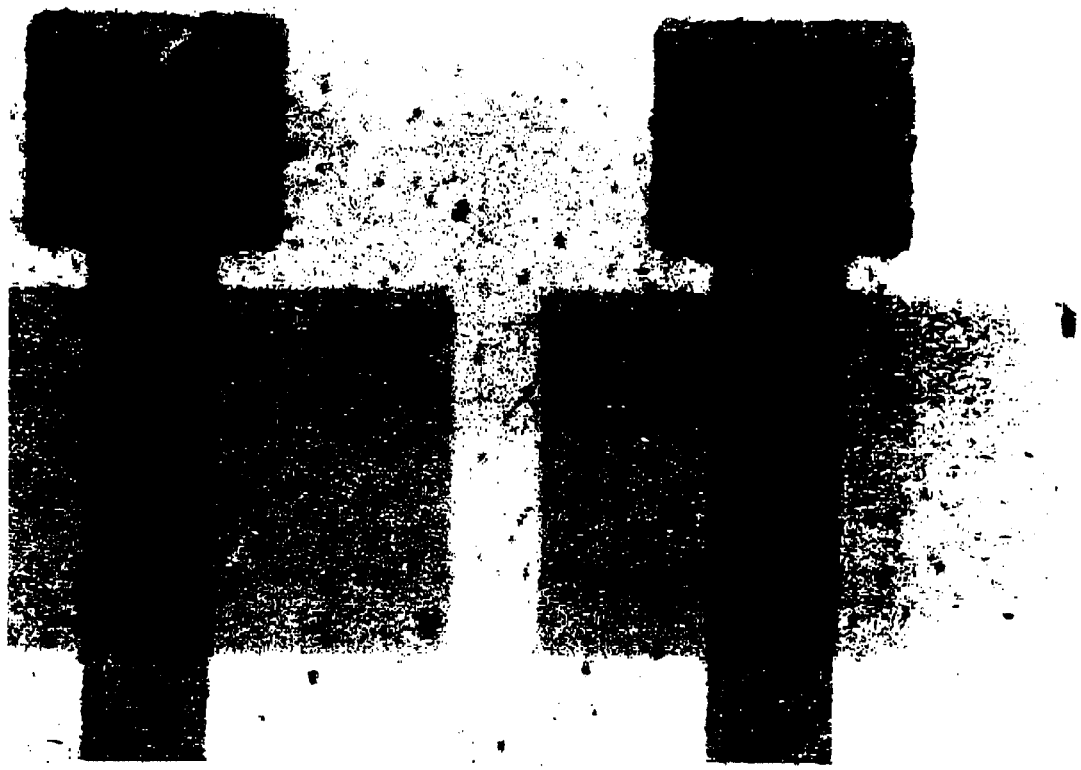

8. Polyaniline acrylamidopropanesulfonic acid was deposited onto a glass slide. On this surface was deposited a pattern of aluminum lines through a metal mask. The pattern was transferred to the polyaniline by oxygen reactive ion etching. The remainder of the aluminum is then etched with a dilute hydrochloric acid solution. This method is ideal for relatively large features. 50 μm polyaniline lines were fabricated in this fashion as is shown in FIGS. 30 and 31.

9. The substituted polythiophenes and in-situ polymerized polypyrroles can also be patterned in this fashion.

10. The polyaniline acrylamidopropanesulfonic acid can be patterned directly by exposing the film to radiation such as electron beam. Upon irradiation, the polymer undergoes cross-linking and becomes insoluble. The unexposed regions are removed with a solvent wash to result in patterns of conducting polyanilines.

The conducting polymer can be spin-applied, dip coated, roller coated, spray coated on to a substrate or it can be in-situ chemically or electrochemically polymerized a surface.

Figure 32:
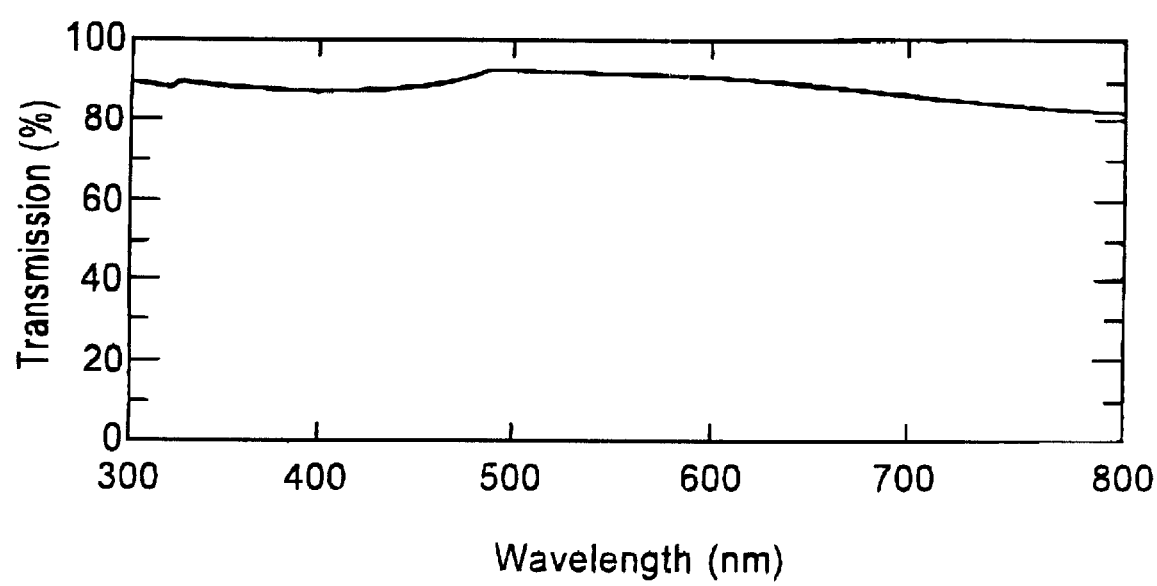
FIG. 32 depicts the optical transmission spectrum for a 500 Angstrom film of polyaniline.

In order for the conducting polymer to be used in liquid crystal displays the optical transmission of the film is preferably in excess of 80% in the visible range. FIG. 32 depicts the optical transmission of the polyaniline acrylamidopropanesulfonic acid (blanket and patterned lines). As can be seen the polymer as a 500 Angstrom film exhibits greater than 90% transmission throughout the visible range. This matches the optical transmission that is typical of annealed indium tin oxide. The conductivity of the polyaniline lines was on the order of 100 S/cm and is preferably greater than 100 S/cm. The material exhibited environmental stability in that there was no change in conductivity over time in air. The material is thermally stable to about 150 °.C.

Figure 33:
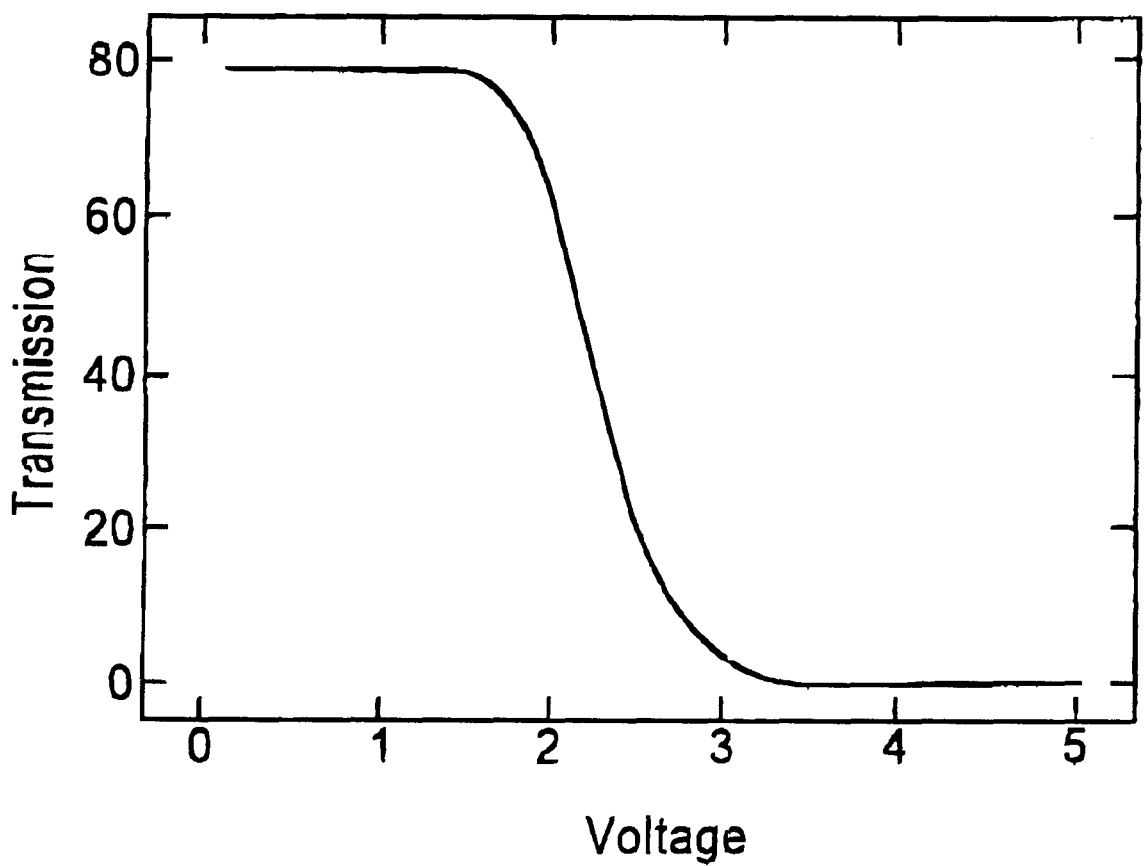
FIG. 33 shows the transmission/voltage characteristics for a liquid crystal display made with 2 polyaniline electrodes.
Figure 34:
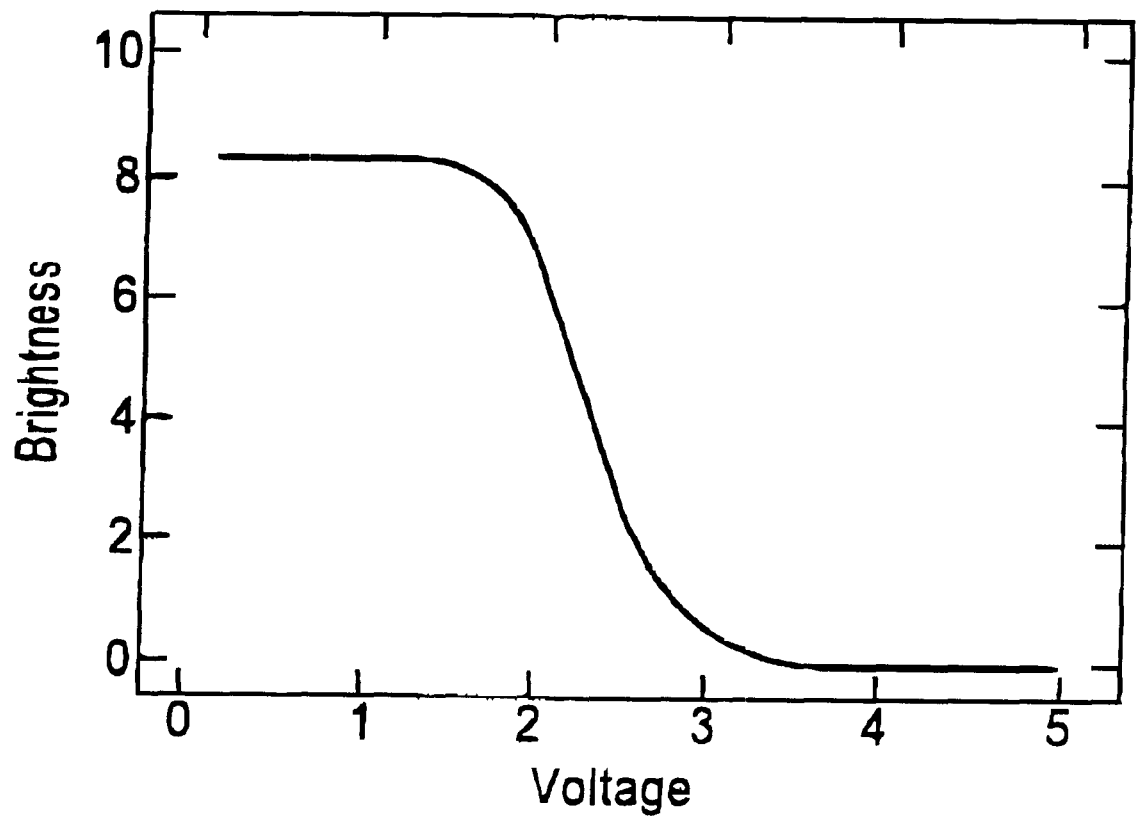
FIG. 34 shows the brightness (transmission)/voltage characteristics for a liquid crystal display made with 2 ITO electrodes.
Figure 35:
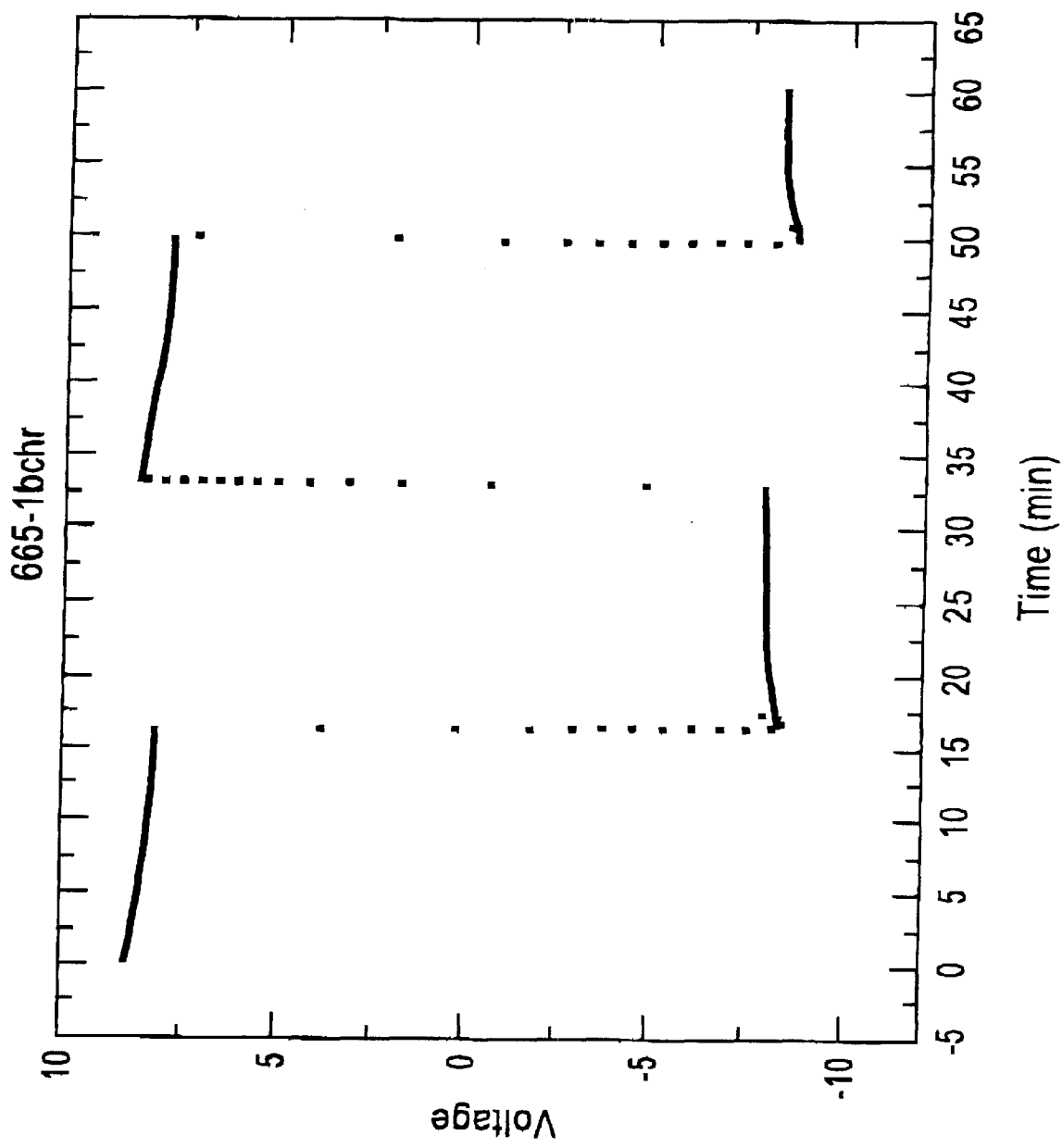
FIG. 35 shows the voltage vs. time curve for a liquid crystal display made with polyaniline electrodes. The charge retention is over 95%.
Figure 36:
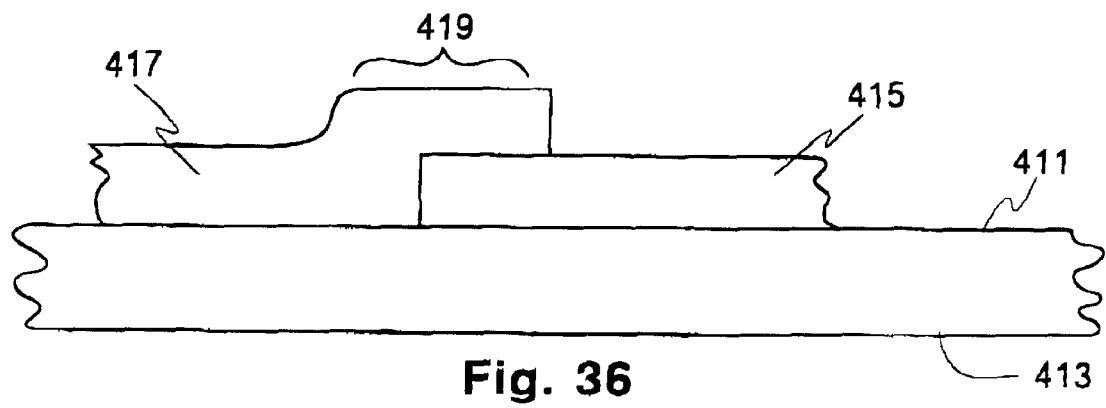
FIGS. 36 and 37 are schematic diagrams of joints between a non-polymeric electrical conductor and a polymeric electrical conductor.
Figure 37:
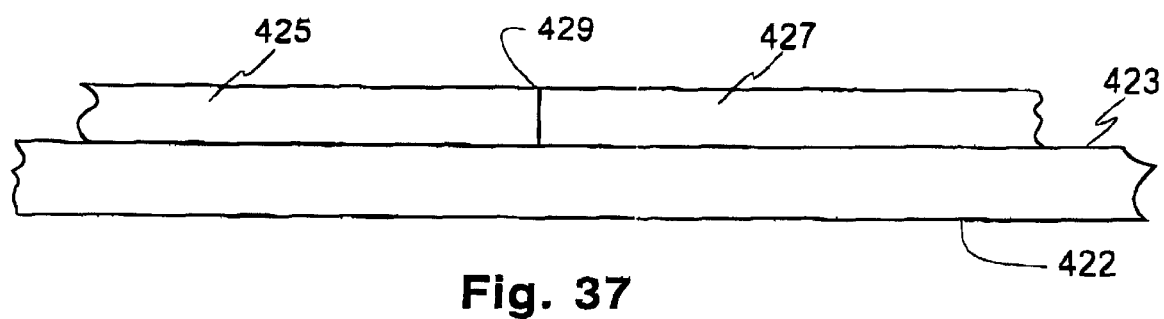
Figure 38:
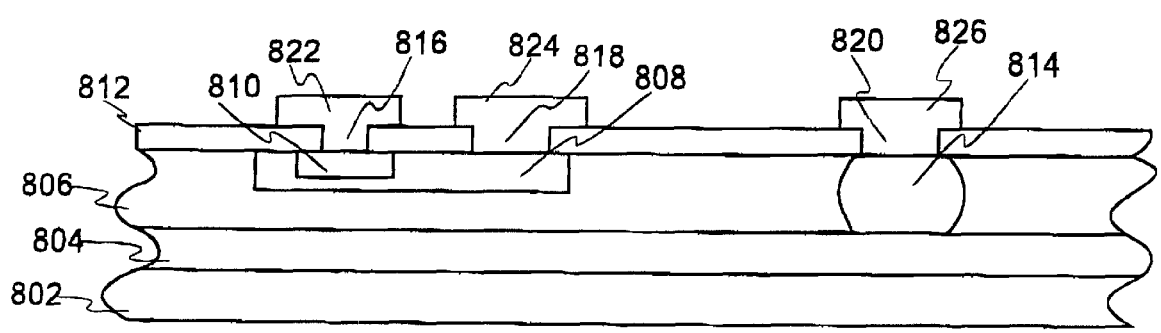
FIG. 38 is a schematic diagram of a bipolar transistor having electrodes according to the present invention.

As the properties of the material looked good, liquid crystal cells were assembled in which a conductive polymer such as polyaniline was used as both electrodes as well as cells in which the polyaniline was used as one electrode while indium tin oxide is used as the second electrode. In the case where polyaniline was used as both electrodes, one of the electrodes consisted of patterned lines whereas the second electrode consisted of a blanket film. On the polyaniline was spin-coated the alignment layer which was polyimide (Nissan SE5210). The polyimide was cured at 125 °. for 1 hour. The thickness of the film was 500 Angstroms. The polyimide layers were then mechanically rubbed. The test cell was filled with a Merck liquid crystal containing a left chiral agent. Polarizers were attached to the outside of the glass with transmissive axis of the polarizer parallel to the rubbing directions. Thus, a right handed 90 °ree twisted nematic test panels were completed. The performance of the liquid crystal cells was then measured. FIG. 33 depicts the transmission/characteristics for the liquid crystal cell consisting of the two polyaniline electrodes. This matches the transmission/voltage characteristics exhibited by crystals consisting of indium tin oxide electrodes (FIG. 34). The charge retention of the liquid crystal containing polyaniline electrodes was 95% at room temperature (FIG. 35). Again this matches the charge retention exhibited by liquid crystal cells consisting of ITO electrodes. Image sticking of the liquid crystal cells were also in good agreement.

FIG. 41 shows a surface 411 of substrate 413 having a layer of material 415 disposed thereon and a layer of material 417 disposed on surface 411 in a manner so that material 417 overlaps material 415 in an overlap region 419 Material 417 can be an electrically conductive polymer according to the present invention and material 415 can be a non-polymeric electrically conductive material, such as a metal or a semiconductor. Also, both regions 417 and 415 can be electrically conductive polymers.

FIG. 42 shows a surface 423 of substrate 421 having layers of material 425 and 427 which abut at interface 429. Material 425 and 427 can be electrically conductive polymers or one of the layers 425 and 427 can be an electrically conductive polymer and the other a non-polymeric electrically conductive material, such as a metal or a semiconductor.

Using the methods of patterning electrically conductive polymers taught herein and using the methods of patterning nonpolymeric electrical conductors known in the art the structures of FIGS. 41 and 42 can be readily made.

FIG. 43 schematically shows a bipolar transistor having a substrate 802, buried subcollector 804, lightly doped region 896, base region 808, emitter region 810, dielectric layer 812 and highly doped region 814 to reach to the subcollector region 804. The dielectric layer has opening 816 for contact of the emitter; opening 818 for contact to the base region and opening 820 for contact to region 814 to contact the subcollector 804. Patterned electrical conductors or electrodes 822, 824 and 826 provide electrical contact to the emitter, base and collector regions, respectively.

Electrodes 822, 824 and 826 can be formed from an electrically conductive polymer according to the present invention. The electrically conductive polymer forming an ohmic contact to the active device regions 810, 808 and 814.

Examples of electrically conductive polymers that can be used to practice the present invention are of substituted and unsubstituted polyparaphenylenes, polyparaphenylevevinylenes, polyanilines, polyazines, polythiophenes, poly-p-phenylene sulfides, polyfuranes, polypyrroles, polyselenophenes, polyacetylenes formed from soluble precursors and combinations thereof and copolymers of monomers thereof. The general formula for these polymers, structures fabricated therewith and methods of use thereof can be found in U.S. Pat. No. 5,198,153 to Angelopoulos et al. and in copending U.S. application Ser. No. 08/193,926 filed on Feb. 9, 1994 now U.S. Pat. No. 5, 571,299 and in copending U.S. application Ser. No. 08/476, 141 pending filed on Jun. 7, 1995, the teachings of which is incorporated herein by reference.

The polyaniline class of conducting polymers has been shown to be one of the most promising and most suited conducting polymers for a broad range of commercial applications. The polymer has excellent environmental stability and offers a simple, one-step synthesis. A number of soluble derivatives can be made. For example, we previously disclosed a new family of water soluble conducting polyanilines in U.S. Pat. No. 5,370,825, the teaching of which is incorporated herein by reference.

The following U.S. patents describe resists useful to practice the present invention are incorporated herein by reference: U.S. Pat. Nos. 5,580,694, 5,554,485, 5,545,509, 5,492,793, 5,401,614, 5,296,332, 5,240,812, 5,071,730, 4,491,628, 5,585,220, 5,561,194, 5,547,812, 5,498,765, 5,486,267, 5,482,817, 5,464,726, 5,380,621, 5,374,500, 5,372,912, 5,342,727, 5,304,457, 5,300,402, 5,278,010, 5,272,042, 5,266,444, 5,198,153, 5,164,278, 5,102,772, 5,098,816, 5,059,512, 5,055,439, 5,047,568, 5,045,431, 5,026,624, 5,019,481, 4,940,651, 4,939,070, 4,931,379, 4,822,245, 4,800,152, 4,760,013, 4,551,418, 5,338,818, 5,322,765, 5,250,395, 4,613,398, 4,552,833, 5,457,005, 5,422,223, 5,338,818, 5,322,765, 5,312,717, 5,229,256, 5,286,599, 5,270,151, 5,250,395, 5,238,773, 5,229,256, 5,229,251, 5,215,861, 5,204,226, 5,115,095, 5,110,711, 5,059,512, 5,041,358, 5,023,164, 4,999,280, 4,981,909, 4,908,298, 4,867,838, 4,816,112, 4,810,601, 4,808,511, 4,782,008, 4,770,974, 4,693,960, 4,692,205, 4,665,006, 4,657,845, 4,613,398, 4,603,195, 4,601,913, 4,599,243, 4,552,833, 4,507,331, 4,493,855, 4,464,460, 4,430,153, 4,307,179, 4,307,178, 5,362,599, 4,397,937, 5,567,569, 5,342,727, 5,294,680, 5,273,856, 4,980,264, 4,942,108, 4,880,722, 4,853,315, 4,601,969, 4,568,631, 4,564,575, 4,552,831, 4,522,911, 4,464,458, 4,409,319, 4,377,633, 4,339,522, 4,259,430, 5,209,815, 4,211,834, 5,260,172, 5,258,264, 5,227,280, 5,024,896, 4,904,564, 4,828,964, 4,745,045, 4,692,205, 4,606,998, 4,600,683, 4,499,243, 4,567,132, 4,564,584, 4,562,091, 4,539,222, 4,493,855, 4,456,675, 4,359,522, 4,289,573, 4,284,706, 4,238,559, 4,224,361, 4,212,935, 4,204,009, 5,091,103, 5,124,927, 5,378,511, 5,366,757, 4,590,094, 4,886,727, 5,268,260, 5,391,464, 5,115,090, 5,114,826, 4,886,734, 4,568,601, 4,678,850, 4,543,319, 4,524,126, 4,497,891, 4,414,314, 4,414,059, 4,398,001, 4,389,482, 4,379,826, 4,379,833, 4,187,331.

While the present invention has been described with respect to preferred embodiments, numerous modifications, changes, and improvements will occur to those skilled in the art without departing from the spirit and scope of the invention. All references cited herein are incorporated herein by reference.

What is claimed is:

1. A structure comprising:
    a substrate;
    a patterned gate formed from a patterned electrically conductive material disposed on said substrate;
    an insulating layer disposed on said patterned gate;
    a patterned source electrode disposed on said insulating layer;
    a patterned drain electrode disposed on said insulating layer;
    each of said patterned source electrode said patterned drain electrode and said patterned gate being formed from an electrically conductive polymer;
    a semiconducting material disposed between said patterned source electrode and said patterned drain electrode and on said insulating layer.

2. A structure according to claim 1 wherein said electrically conductive polymer is selected from the group consisting of substituted and unsubstituted polyparaphenylene vinylenes, polyparaphenylenes, polyanilines, polythiophenes, polyazines, polyfuranes, polypyrroles, polyselenophenes, poly-p-phenylene sulfides, polyacetylenes, combinations thereof and blends thereof with other polymers and copolymers of the monomers thereof.

3. A structure according to claim 1 wherein said semiconducting material is selected from the group consisting of an organic and an inorganic material.

4. A structure comprising:
    an electrically conductive substrate;
    said substrate being a gate electrode;
    an insulating layer disposed on said substrate;
    a patterned source electrode disposed on said insulating layer;
    a patterned drain electrode disposed on said insulating layer;
    a semiconducting material disposed between said patterned source electrode, said patterned drain eletrode and on said gate electrode;
    each of said patterned source electrode and said patterned drain electrode and said gate being an electrically conductive polymer.

5. A structure according to claim 4 wherein said electrically conductive polymer is selected from the group consisting of substituted and unsubstituted polyparaphenylene vinylenes, polyparaphenylenes, polyanilines, polythiophenes, polyazines, polyfuranes, polypyrroles, polyselenophenes, poly-p-phenylene sulfides, polyacetylenes, combinations thereof and blends thereof with other polymers and copolymers of the monomers thereof.

6. A structure according to claim 4 wherein said semiconducting material is selected from the group consisting of an organic and an inorganic material.

7. A structure according to claim 4 wherein said substrate is formed from a material selected from the group consisting of silicon, germanium and galium arsenide.

8. A structure comprising:
    a substrate;
    a patterned gate disposed on said substrate;
    said gate being an electrically conductive material;
    an insulating layer disposed on said patterned gate;
    a semiconductor layer disposed on said insulating layer;
    a patterned source electrode disposed on said semiconductor layer;
    a patterned drain electrode disposed on said semiconductor layer;
    each of said patterned gate, said patterned source electrode and said patterned drain electrode being an electrically conductive polymer.

9. A structure according to claim 8 wherein said electrically conductive polymer is selected from the group consisting of substituted and unsubstituted polyparaphenylene vinylenes, polyparaphenylenes, polyanilines, polythiophenes, polyazines, polyfuranes, polypyrroles, polyselenophenes, poly-p-phenylene sulfides, polyacetylenes, combinations thereof and blends thereof with other polymers and copolymers of the momers hereof.

10. A structure according to claim 8 wherein said semiconductor layer is selected from the group consisting of an organic and an inorganic material.

11. A structure according to claim 10 wherein said semiconductor layer is selected from the group consisting of Si, Ge, GaAs and combinations thereof.

12. A structure comprising:
an electrically conductive substrate;
said substrate being a gate electrode;
an insulating layer disposed on said gate electrode;
a semiconductor layer disposed on said insulating layer;
a patterned source electroded disposed on said semiconductor layer;
a pattered drain electrode disposed on said semiconductor layer;
each of said gate electrode said patterned source electrode and said patterned drain electrode being an electrically conductive polymer.

13. A structure according to claim 12 wherein said electrically conductive polymer is selected from the group consisting of substituted and unsubstituted polyparaphenylene vinylenes, polyparaphenylenes, polyanilines, polythiophenes, polyazines, polyfaranes, polypyrroles, polyselenophenes, poly-p-phenylene sulfides, polyacetylenes, combinations thereof and blends thereof with other polymers and copolymers of the monomers thereof.

14. A structure according to claim 12 wherein said semiconductor layer is selected from the group consisting of an organic and an inorganic material.

15. A structure comprising:
an insulating layer having a first side and a second side;
a gate disposed on said first side of said insulating layer;
a semiconducting layer disposed on said second side;
a patterned source electrode disposed in electrical contact with said semiconductor layer;
a patterned drain electrode disposed in contact with said semiconductor layer;
each of said gate, said patterned source and said patterned drain being an electrically conductive polymer.

16. A structure according to claim 15 wherein said electrically conductive polymer is selected from the group consisting of substituted and unsubstituted polyparaphenylene vinylenes, polyparaphenylenes, polyanilines, polythiophenes, polyazines, polyfuranes, polypyrroles, polyselenophenes, poly-p-phenylene sulfides, polyacetylenes, combinations thereof and blends thereof with other polymers and copolymers of the monomers thereof.

17. A structure according to claim 16 wherein said semiconductor layer is selected from the group consisting of an organic and an inorganic material.

18. A structure comprising:
a semiconducting layer having a first and second side;
a dielectric layer on said first side;
a first patterned electrically conductive layer on said dielectric layer;
a second and a third patterned electrically conductive layer on said second side;
each of said first and said second and said third patterned electrically conductive layers being an electrically conductive polymer.

19. A structure comprising:
an insulating layer having a first side and a second side;
a patterned gate disposed on said first side of said insulating layer;
a patterned source electrode and a patterned drain electrode disposed on said second side;
each of said patterned gate, said patterned source electrode and said patterned drain electrode being an electrically conductive polymer.

20. A structure comprising;
a semiconductor layer;
a first opening in a dielectric layer exposing said semiconductor layer therein at a first region;
a second opening in said dielectric layer exposing said semiconductor layer therein at a second region;
a first pattern of an electrical conductor disposed in electrical contact with said first region;
a second pattern of an electrical conductor disposed in electrical contact with said second region;
a third pattern of an electrical conductor disposed on said dielectric layer between said first and said second patterns;
at least one of said first, said second and said third pattern of an electrical conductor is a patterned electrically conductive polymer.

21. A structure according to claim 19 wherein said electrically conductive polymer is selected from the group consisting of substituted and unsubstituted polyparaphenylene vinylenes, polyparaphenylenes, polyanilines, polythiophenes, polyazines, polyfuranes, polypyrroles, polyselenophenes, poly-p-phenylene sulfides, polyacetylenes, combinations thereof and blends thereof with other polymers and copolymers of the monomers thereof.

22. A structure according to claim 19 wherein said semiconductor material is selected from the group consisting of an organic and an inorganic material.

23. A structure according to claim 19 wherein said semiconductor layer is selected from the group consisting of Si, Ge, GaAs and combinations thereof.

24. A structure according to claim 20 wherein said electrically conductive polymer is selected from the group consisting of substituted and unsubstituted polyparaphenylene vinylenes, polyparaphenylenes, polyanilines, polythiophenes, polyazines, polyfuranes, polypyrroles, polyselenophenes, poly-p-phenylene sulfides, polyacetylenes, Combinations thereof and blends thereof with other polymers and copolymers of the monomers thereof.

25. A structure according to claim 20 wherein said semiconductor material is selected from the group consisting of an organic and an inorganic material.

26. A structure according to claim 20 wherein said semiconductor layer is selected from the group consisting of Si, Ge, GaAs and combinations thereof.

27. A structure according to claim 1 wherein said semiconductor material is selected from the group consisting of Si, Ge, GaAs and combinations thereof.

28. A structure according to claim 4 wherein said semiconductor material is selected from the group consisting of Si, Ge, GaAs and combinations thereof.

29. A structure according to claim 12 wherein said substrate comprises a material selected from the group consisting of Si, Ge, GaAs and combinations thereof.

30. A structure according to claim 12 wherein said semiconductor layer comprises a material selected from the group consisting of $i, Ge, GaAs and combinations thereof.

31. A structure according to claim 15 wherein said semiconductor layer comprises a material selected from the group consisting of Si, Ge, GaAs and combinations thereof.

32. A structure according to claim 18 wherein said semiconductor layer comprises a material selected from the group consisting of Si, Ge, GaAs and combinations thereof.

* * * * *